US010193011B1

(12) United States Patent
Banna et al.

(10) Patent No.: US 10,193,011 B1
(45) Date of Patent: Jan. 29, 2019

(54) METHOD OF MANUFACTURING A 3 COLOR LED INTEGRATED SI CMOS DRIVER WAFER USING DIE TO WAFER BONDING APPROACH

(71) Applicant: GLOBALFOUNDRIES Inc., Grand Cayman (KY)

(72) Inventors: Srinivasa Banna, San Jose, CA (US); Deepak Nayak, Fremont, CA (US); Luke England, Saratoga Springs, NY (US); Rahul Agarwal, Waterford, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/650,427

(22) Filed: Jul. 14, 2017

(51) Int. Cl.
*H01L 27/30* (2006.01)
*H01L 31/18* (2006.01)
*H01L 27/15* (2006.01)

(52) U.S. Cl.
CPC ........ *H01L 31/1848* (2013.01); *H01L 27/153* (2013.01); *H01J 2237/3321* (2013.01)

(58) Field of Classification Search
None
See application file for complete search history.

(56) References Cited

U.S. PATENT DOCUMENTS 6,730,937 B2 5/2004 Dai et al.
7,947,529 B2 * 5/2011 Koon .................. H01L 23/3107 257/E21.499
8,642,363 B2 2/2014 Lau et al.
8,912,581 B2 * 12/2014 Lin ..................... H01L 23/5222 257/259
9,829,710 B1 * 11/2017 Newell .............. G02B 27/0172
2005/0122349 A1 * 6/2005 Yamazaki ............ G09G 3/3233 345/694
2008/0128900 A1 * 6/2008 Leow .................... H01L 21/561 257/723
2009/0078955 A1 3/2009 Fan et al.
2010/0159643 A1 * 6/2010 Takahashi ............... H01L 21/56 438/108
2016/0358966 A1 12/2016 Borthakur et al.
2017/0162101 A1 * 6/2017 Ohara .................. G09G 3/2018

* cited by examiner

*Primary Examiner* — Thao P Le
(74) *Attorney, Agent, or Firm* — Ditthavong & Steiner, P.C.

(57) ABSTRACT

Methods of forming an integrated RGB LED and Si CMOS driver wafer and the resulting devices are provided. Embodiments include providing a plurality of first color die over a CMOS wafer, each first color die being laterally separated with a first oxide and electrically connected to the CMOS wafer; providing a second color die above each first color die, each second color die being separated from each other with a second oxide, bonded to a first color die, and electrically connected to the CMOS wafer through the bonded first color die; removing a portion of each second color die to expose a portion of each bonded first color die; forming a conformal TCO layer over each first and second color die and on a side surface of each second color die and oxide; forming a PECVD oxide layer over the CMOS wafer; and planarizing the PECVD oxide layer.

18 Claims, 38 Drawing Sheets

METHOD OF MANUFACTURING A 3 COLOR LED INTEGRATED SI CMOS DRIVER WAFER USING DIE TO WAFER BONDING APPROACH

TECHNICAL FIELD

The present disclosure relates to light-emitting diodes (LEDs). The present disclosure is particularly applicable to semiconductor-based LEDs.

BACKGROUND

Red, green, and blue (RGB) color LED integration on silicon (Si) complementary metal-oxide-semiconductor (CMOS) wafers are highly desirable for producing low power and high brightness micro displays for use in augmented reality (AR), virtual reality (VR), video projection, and military applications. Known processes for integrating 3 color LEDs on Si CMOS driver circuits include transfer methods using pick & place, die-to-die bonding using micro-bump technology, and 3 color LED layer transfer on glass substrates and Si wafers (LED metallization after layer transfer). However, the known processes suffer from light re-absorption issues leading to poor color efficiency as well as substrate and color die material constraints.

A need therefore exists for methodology enabling RGB LED integration with a Si CMOS driver wafer without poor color efficiency or material constraints and the resulting device.

SUMMARY

An aspect of the present disclosure is method of forming an integrated RGB LED and Si CMOS driver wafer.

Another aspect of the present disclosure is an integrated RGB LED and Si CMOS driver wafer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a plurality of first color die over a CMOS wafer, each first color die being laterally separated with a first oxide and electrically connected to the CMOS wafer; providing a second color die above each first color die, each second color die being separated from each other with a second oxide, bonded to a first color die, and electrically connected to the CMOS wafer through the bonded first color die; removing a portion of each second color die to expose a portion of each bonded first color die; forming a conformal transparent conductive oxide (TCO) layer over each first and second color die and on a side surface of each second color die and oxide; forming a plasma-enhanced chemical vapor deposition (PECVD) oxide layer over the CMOS wafer; and planarizing the PECVD oxide layer.

Aspects of the present disclosure include each first and second color die and the CMOS wafer being a known good die (KGD). Other aspects include each first color die including two LEDs and each second color die including one LED or each first color die including the one LED and each second color die including the two LEDs. Further aspects include wherein each first or second color die includes the two LEDs, each first or second color die further includes blue and green, green and red, or blue and red indium gallium nitride (InGaN) LEDs laterally separated within an oxide layer, a gallium nitride (GaN) buffer layer, and a substrate. Another aspect includes wherein each first or second color die includes the one LED and the one LED is red, each first or second color die includes an aluminum indium gallium phosphide (AlInGaP) LED within the oxide layer, a gallium phosphide (GaP) buffer layer, and the substrate. Further aspects include wherein each first or second color die includes the one LED and the one LED is blue or green, each first or second color die further includes an InGaN LED within the oxide layer, the GaN buffer layer, and the substrate. Other aspects include bonding and electrically connecting each first and corresponding second color die by: filling a first trench formed between each pair of adjacent first color dice with the first oxide; planarizing the first oxide down to the substrate of the first color dice; planarizing the substrate of the first color dice and first oxide down to the GaN or GaP buffer layer of the first color dice; etching a contact hole through the GaN or GaP buffer and oxide layers of each first color die for each LED of each second color die; forming a conformal nitride liner on sidewalls of each contact hole; filling each contact hole with a metal; planarizing the metal down to the GaN or GaP buffer layer of the first color dice; and connecting each LED of each second color die to a corresponding metal contact. Further aspects include removing the portion of each second color die by: planarizing the substrate of the second color dice and second oxide down to the GaN or GaP buffer layer of the second color dice; forming a mask over the two LEDs or one LED of each second color die and oxide and a portion of the GaN or GaP buffer and oxide layers on opposite sides of the one LED or two LEDs; and etching an exposed portion of the GaN or GaP buffer and oxide layers down to the GaN or GaP buffer layer of the first color dice. Additional aspects include the substrate being Si, sapphire, or silicon carbide (SiC).

Another aspect of the present disclosure is a device including: a plurality of first color die over a CMOS wafer, each first color die laterally separated with a first oxide and electrically connected to the CMOS wafer; one or two metal contacts through each first color die down to the CMOS wafer; a second color die and an adjacent second oxide above each first color die and oxide, respectively, each second color die bonded to a first color die and electrically connected to the CMOS wafer through the bonded first color die; a conformal TCO layer over each first and second color die and on a side surface of each second color die and oxide; and a planar PECVD layer over the CMOS wafer.

Aspects of the device include each first color die including two LEDs and each second color die including one LED or each first color die including the one LED and each second color die including the two LEDs. Other aspects include wherein each first or second color die includes the two LEDs, each first and second color die further includes blue and green, green and red, or blue and red InGaN LEDs laterally separated within an oxide layer, a GaN buffer layer, and a substrate. Further aspects include wherein each first or second color die includes the one LED and the one LED is red, each first and second color die further includes an AlInGaP LED within the oxide layer, a GaP buffer layer, and the substrate. Other aspects include wherein each first or second color die includes the one LED and the one LED is blue or green, each first and second color die further includes an InGaN LED within the oxide layer, the GaN buffer layer, and the substrate. Another aspect includes the GaN or GaP buffer and oxide layers of each second die not covering an LED of a bonded first die. Additional aspects include a third color die and an adjacent third oxide above each second color die and oxide, respectively, each third color die bonded to a second color die and electrically connected to the CMOS wafer through the bonded second color die; and a conformal TCO layer over each third color die and on a side surface of each third color die and oxide. Other aspects include wherein the first, second, and third color dice each including blue, green, or red LEDs, and none of the first and second, first and third, or second and third color dice including a same color LED. Further aspects include wherein each first, second, or third die includes the blue or green LED, each first, second, or third die further includes a blue or green InGaN LED within an oxide layer, a GaN buffer layer, and a substrate, and wherein each first, second, or third die includes the red LED, each first, second, or third die further includes a red AlInGaP LED within an oxide layer, a GaP buffer layer, and a substrate. Another aspect includes the substrate being Si, sapphire, or SiC. Additional aspects include the GaN or GaP buffer and oxide layers of each of the third color die not covering an LED of each of the first and second color dice. Other aspects include each first, second, and third color die and the CMOS wafer being a KGD. Further aspects include the first, second, and third oxide being spin-on glass or low-temperature plasma-enhanced chemical vapor deposition oxide (LT-PECVD).

A further aspect of the present disclosure is a method including: providing a plurality of first color die over a CMOS wafer, each first color die being laterally separated with a first oxide and electrically connected to the CMOS wafer; providing a second color die above each first color die, each second color die being separated from each other with a second oxide, bonded to a first color die, and electrically connected to the CMOS wafer through the bonded first color die; providing a third color die above each second color die, each third color die being separated from each other with a third oxide, bonded to a second color die, and electrically connected to the CMOS wafer through the bonded second color die; removing a portion of each second and each third color die to expose a portion of each first and second color die, respectively; forming a conformal TCO layer over each first, second, and third color die and on a side surface of each second and third color die and oxide; forming a PECVD oxide layer over the CMOS wafer; and planarizing the PECVD oxide layer.

Aspects of the present disclosure include each first, second, and third color die and the CMOS wafer being a KGD. Other aspects include the first, second, and third color dice each including blue, green, or red LEDs, and none of the first and second, first and third, or second and third color dice comprise a same color LED. Further aspects include wherein each first, second, and third color die includes the blue or green LED, each first, second, and third color die further includes the blue or green InGaN LED within an oxide layer, a GaN buffer layer, and a substrate. Another aspect includes wherein each first, second, or third color die includes the red LED, each first, second, or third color die further includes a red AlInGaP LED within an oxide layer, a GaP buffer layer, and a substrate. Other aspects include bonding and electrically connecting each first and corresponding second color die by: filling a first trench formed between each pair of adjacent first color dice with the first oxide; planarizing the first oxide down to the substrate of the first color dice; planarizing the substrate of the first color dice and first oxide down to the GaN or GaP buffer layer of the first color dice; etching two contact holes laterally separated through the GaN or GaP buffer and oxide layers of each first color die; forming a conformal nitride liner on sidewalls of each of the two contact holes; filling the two contact holes with a metal; planarizing the metal down to the GaN or GaP buffer layer of the first color dice; and connecting the blue, green, or red LED of each second color die to one of the two metal contacts.

Further aspects include bonding and electrically connecting each second and corresponding third color die by: filing a second trench formed between each pair of adjacent second color dice with the second oxide; planarizing the second oxide down to the substrate of the second color dice; planarizing the substrate of the second color dice and second oxide down to the GaN or GaP buffer layer of the second color dice; etching a contact hole through the GaN of GaP buffer and oxide layers of each second color die over an open metal contact of the two metal contacts; forming a conformal nitride liner on sidewalls of the contact hole; filing the contact hole with a metal; planarizing the metal down to the GaN or GaP buffer layer of the second color dice; and connecting the blue, green, or red LED of each third color die to the metal contact. Another aspect includes removing the portion of each second and each third color die by: planarizing the substrate of the third color dice and oxide down the GaN or GaP buffer layer of the third color dice; forming a first mask over the blue, green, or red LED of each third color die and oxide and a portion of the GaN or GaP buffer and oxide layers on opposite sides of the blue, green, or red LED; etching an exposed portion of the GaN or GaP buffer and oxide layers of the third color dice down to the GaN or GaP buffer layer of the second color dice; forming a second mask over the blue, green, or red LED of each third and second color die and third oxide, the portion of the GaN and GaP buffer and oxide layers, and a portion of the GaN or GaP buffer and oxide layers on opposite sides of the blue, green, or red LED of each second color die; and etching an exposed portion of the GaN or GaP buffer and oxide layers of the second color die down to the GaN or GaP buffer of the first color dice. Further aspects include the substrate being silicon Si, sapphire, or SiC.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
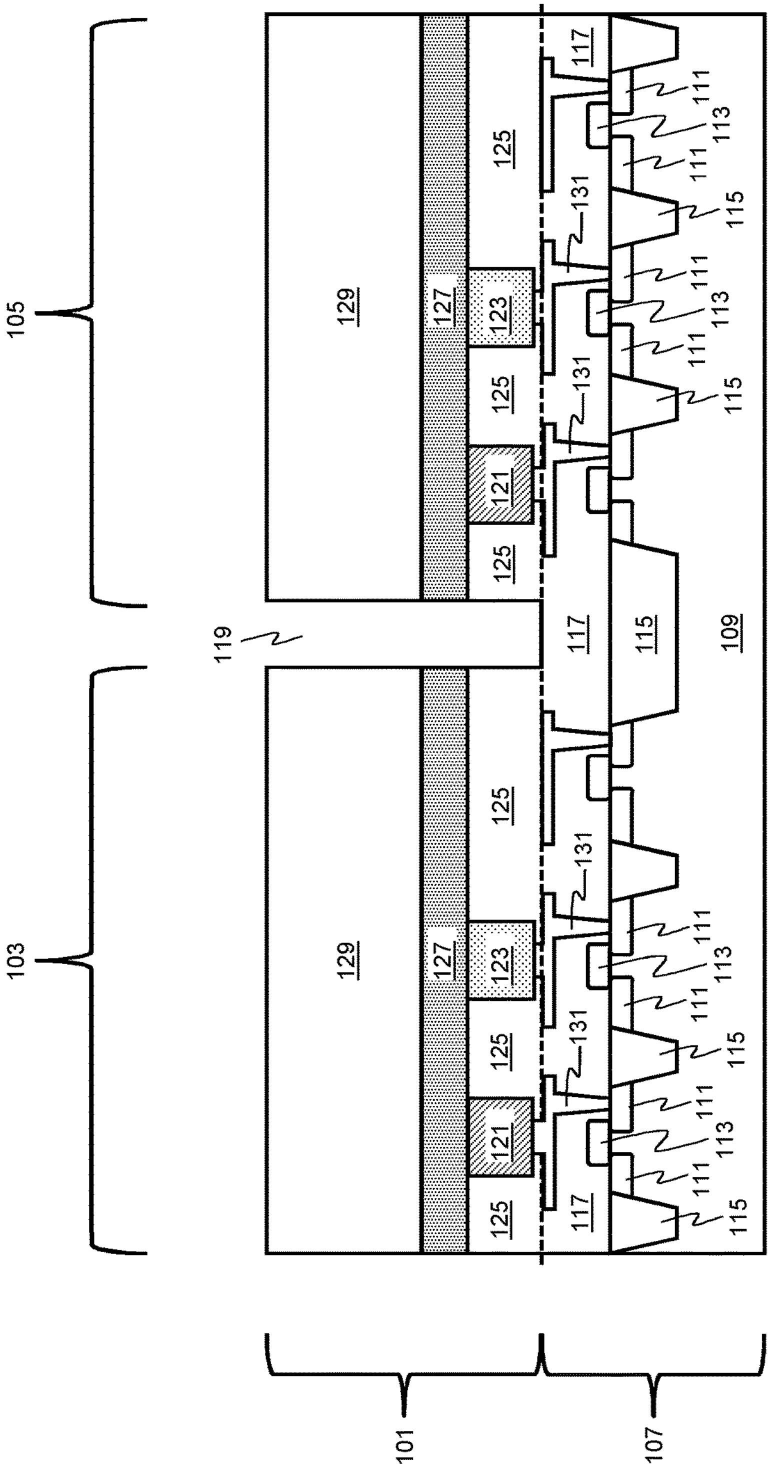
FIGS. 1 through 11 schematically illustrate cross-sectional views of a process flow for forming an integrated RGB LED and Si CMOS driver wafer, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of color inefficiency, substrate size, substrate and color die material constraints, high costs, and low yields attendant upon integrating RGB color LEDs on the same CMOS driver wafer. The problems are solved, inter alia, by bonding one or two color LED dice formed of the same or different materials on a Si CMOS driver wafer using only known good LED dice on known good Si CMOS dice.

Methodology in accordance with embodiments of the present disclosure includes providing a plurality of first color die over a CMOS wafer, each first color die being laterally separated with a first oxide and electrically connected to the CMOS wafer. A second color die is provided above each first color die, each second color die being separated from each other with a second oxide, bonded to a first color die, and electrically connected to the CMOS wafer through the bonded first color die. A portion of each second color die is removed to expose a portion of each bonded first color die and a TCO layer is formed over each first and second color die and on a side surface of each second color die and oxide. A PECVD oxide layer is formed over the CMOS wafer and planarized.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1 through 11 schematically illustrate cross-sectional views of a process flow for forming an integrated RGB LED and Si CMOS driver wafer, in accordance with an exemplary embodiment. Adverting to FIG. 1, a plurality of laterally separated color die 101, e.g., color die 103 and 105, are each bonded to a CMOS wafer 107 that includes a substrate 109, source/drain (S/D) regions 111, gates 113, shallow trench isolation (STI) structures 115, and an oxide layer 117. Each color die 101 and the CMOS wafer 107 are KGD and the substrate 109 may be formed, e.g., of Si or a non-Si material, e.g., sapphire. Each color die 101 is laterally separated by a trench 119 and includes the laterally separated LEDs 121 and 123, e.g., formed of InGaN, within an oxide layer 125, a GaN buffer layer 127, and a substrate 129, e.g., formed of Si, sapphire, or SiC. Each LED 121 and 123 is electrically connected to the CMOS wafer 107 via a metal contact 131 within the oxide layer 117 and the LEDs 121 and 123 may be blue and green, green and red, or blue and red. By way of example, and not by way of limitation, the LEDs 121 and 123 in this instance are blue and green, respectively, or vice-versa.

Figure 2:
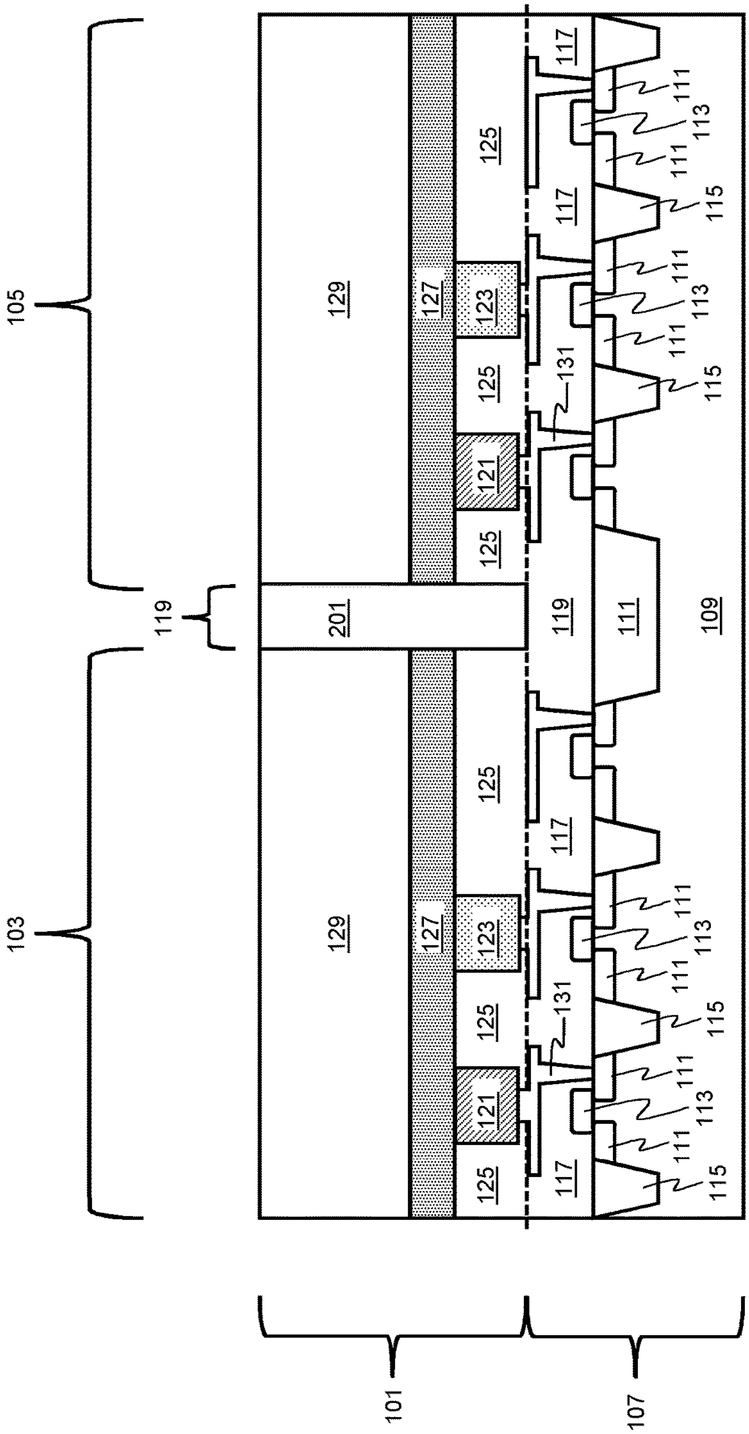
Figure 3:
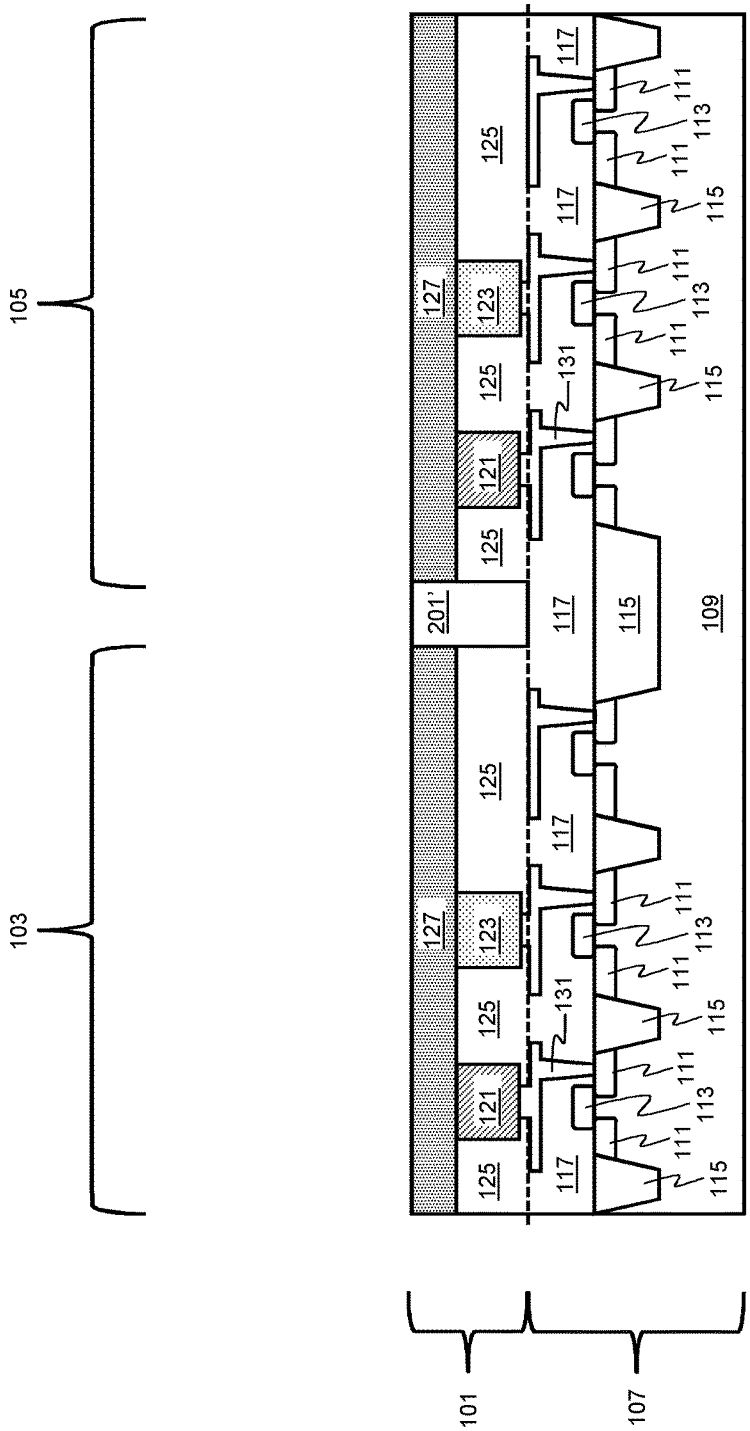
Figure 4:
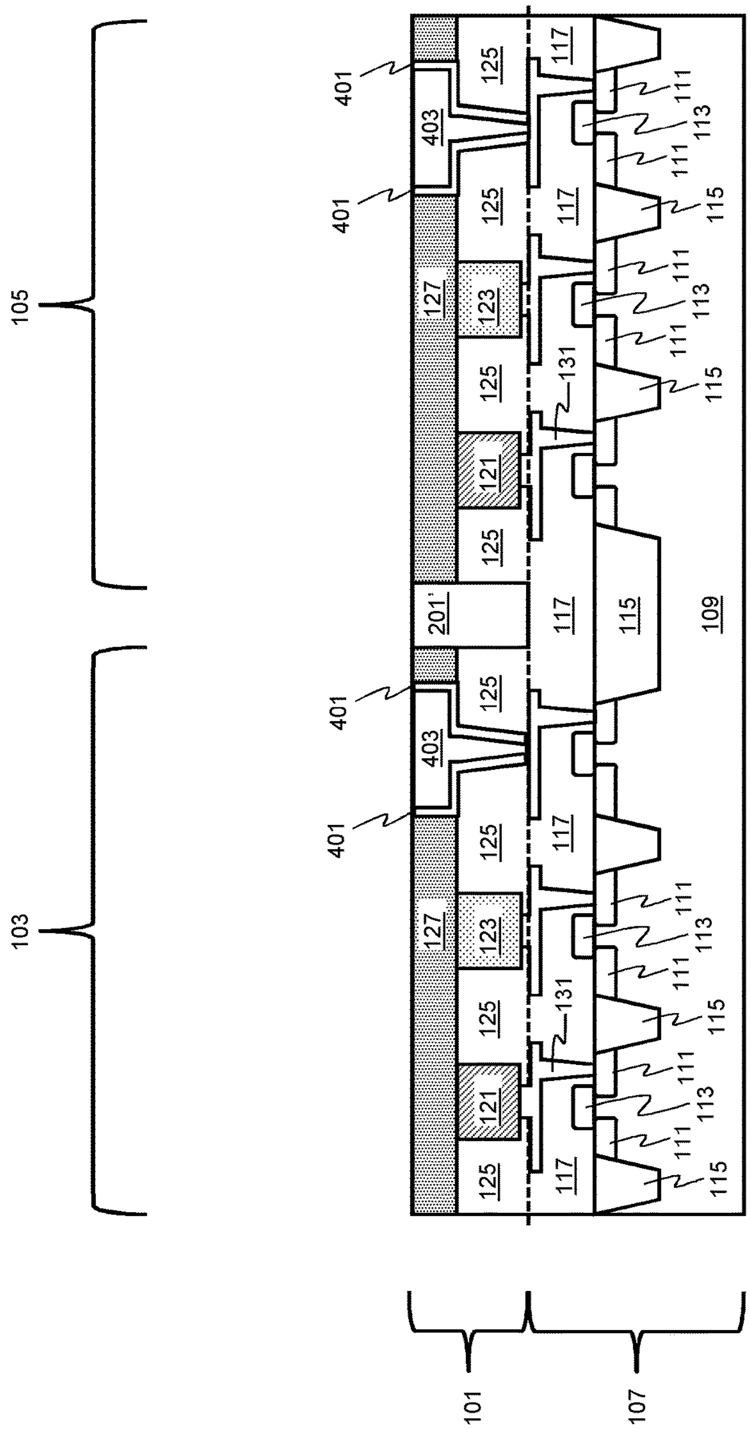

The trench 119 is then filled with an oxide 201, e.g., formed of spin-on glass or LT-PECVD, and the oxide 201 is planarized, e.g., by chemical mechanical polishing (CMP), down to the substrate 129, as depicted in FIG. 2. Adverting to FIG. 3, the oxide 201 and the substrate 129 are planarized, e.g., by CMP, down to the GaN buffer layer 127, forming the oxide 201'. A contact hole (not shown for illustrative convenience) is then formed through the GaN buffer and oxide layers 127 and 125, respectively; a conformal nitride liner 401 is formed on the sidewalls of each contact hole; each contact hole is filled with a metal 403, e.g., copper (Cu), tungsten (W), or aluminum (Al); and the metal 403 is planarized, e.g., by CMP, down to the GaN buffer layer 127, as depicted in FIG. 4.

Figure 5:
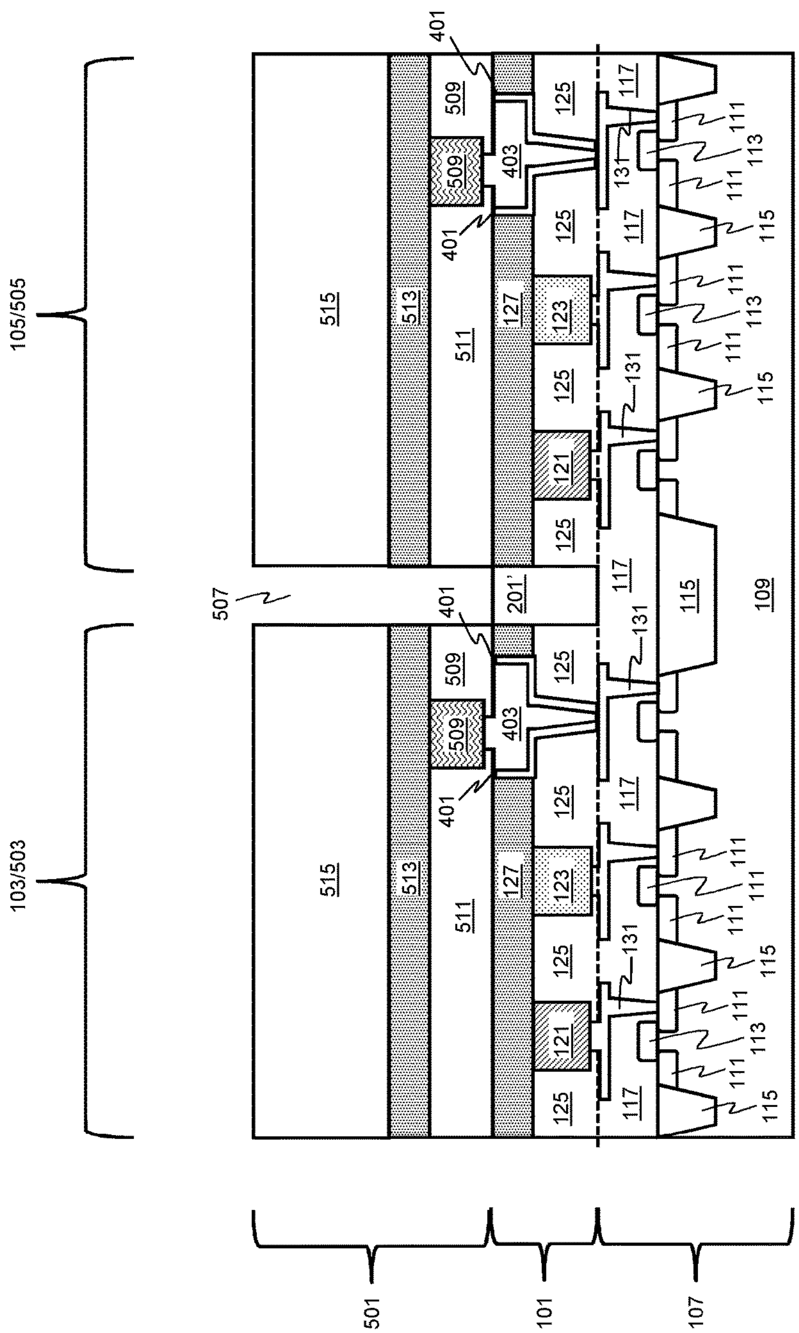

Adverting to FIG. 5, a plurality of color die 501, e.g., color die 503 and 505, are each bonded to a color die 101, e.g., color die 103 and 105, respectively. Like each color die 101, each color die 501 is a KGD and is laterally separated from each other color die 501 by a trench 507. Each color die 501 includes one LED 509 within an oxide layer 511, a GaN or GaP buffer layer 513, and a substrate 515, e.g., formed of Si, sapphire, or SiC, and each LED 509 is electrically connected to the CMOS wafer 107 via the metal contacts 403 and 131. In the instance where the LED 509 is red, each color die 501 includes an AlInGaP LED 509 and a GaP buffer layer 513, but in the instance where the LED 509 is blue or green, each color die 501 includes an InGaN LED 509 and a GaN buffer layer 513. By way of example, and not by way of limitation, the LED 509 is red in this instance and, therefore, each color die 501 includes an AlInGaP LED 509 and a GaP buffer layer 513.

Figure 6:
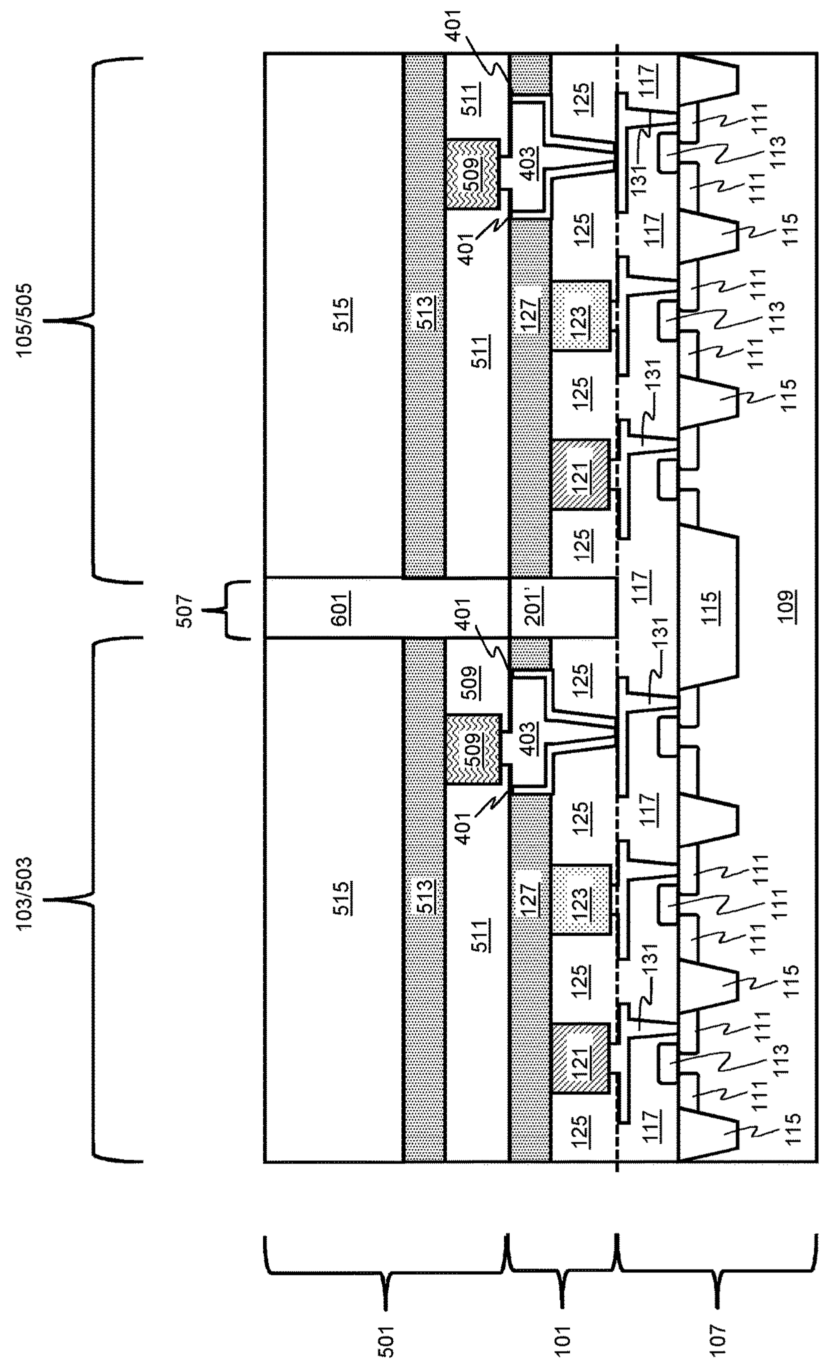
Figure 7:
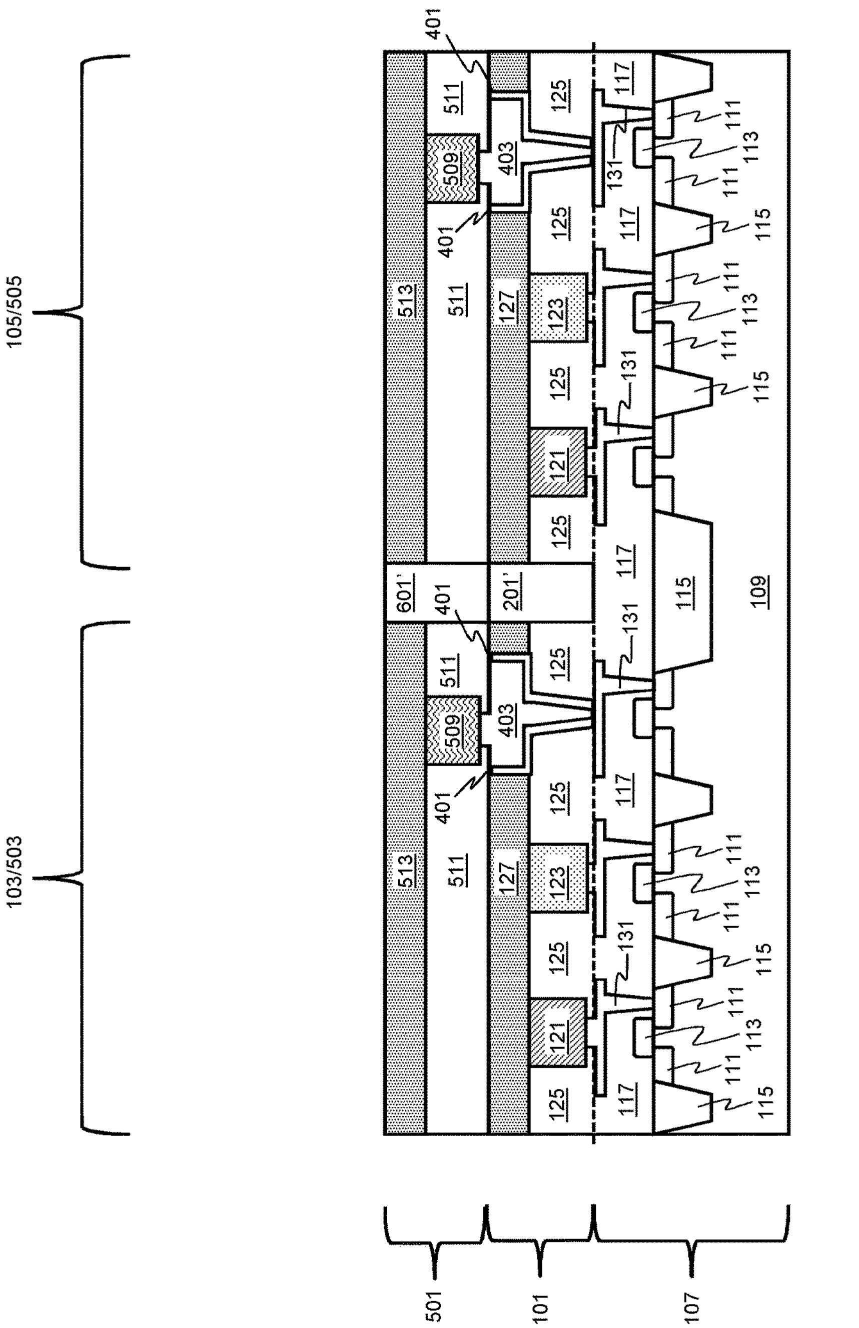
Figure 8:
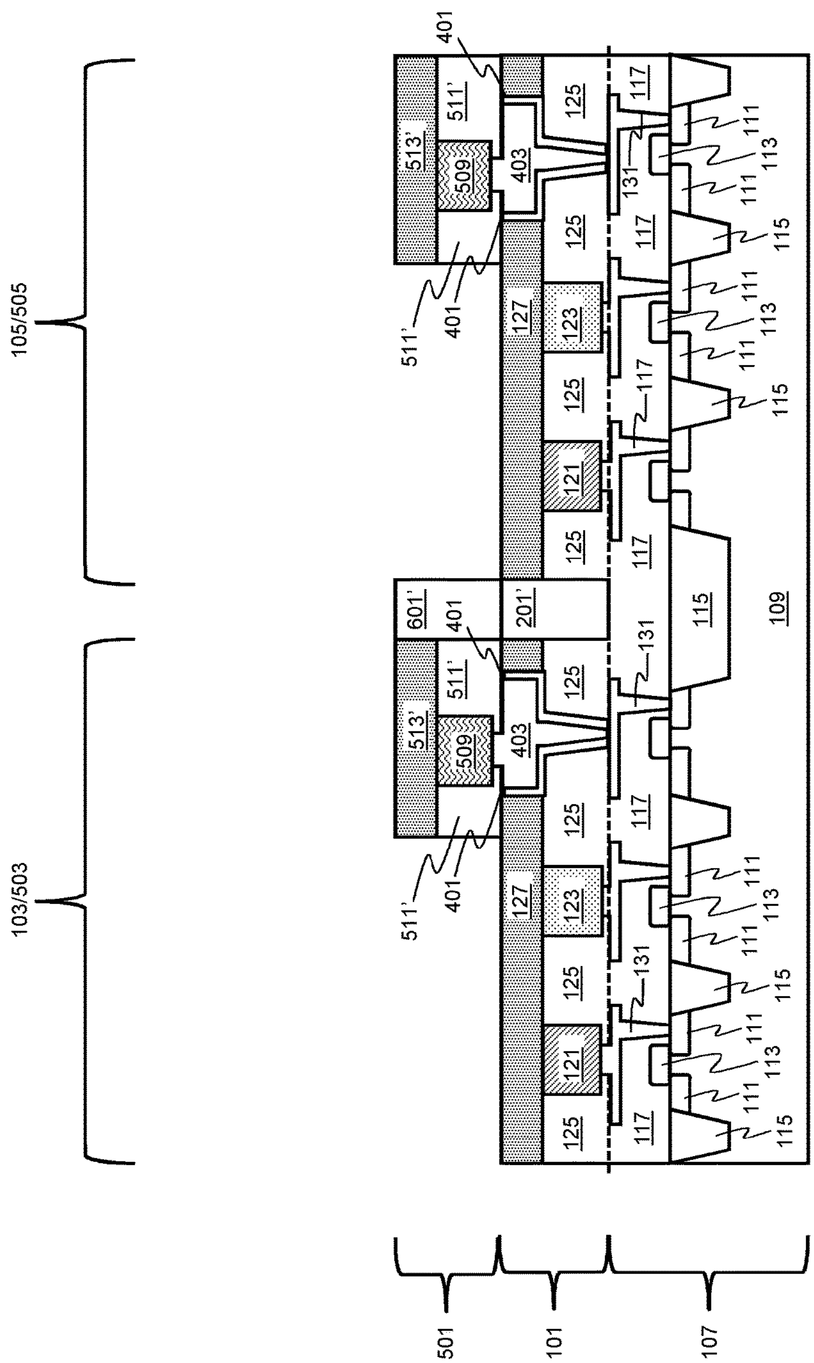

Next, the trench 507 is filled with an oxide 601, e.g., formed of spin-on glass or LT-PECVD, and the oxide 601 is planarized, e.g., by CMP, down to the substrate 515, as depicted in FIG. 6. Adverting to FIG. 7, the oxide 601 and the substrate 515 are planarized, e.g., by CMP, down to the GaP or GaN buffer layer 513, forming the oxide 601'. A portion of each color die 501 is then removed to expose a portion of each bonded color die 101 below, as depicted in FIG. 8. The portion of each color die 501 may be removed, e.g., by forming a mask (not shown for illustrative convenience) over each LED 509, the oxide 601', and portions of the GaP or GaN buffer layer 513 and oxide layer 511 on opposite sides of the LED 509. The exposed portion of the GaP or GaN buffer layer 513 and oxide layer 511 is then etched, e.g., by a dry etch or an inductively coupled plasma (ICP) etch, down to the GaN buffer layer 127 of each color die 101, forming the GaP or GaN buffer layer 513' and the oxide layer 511'.

Figure 9:
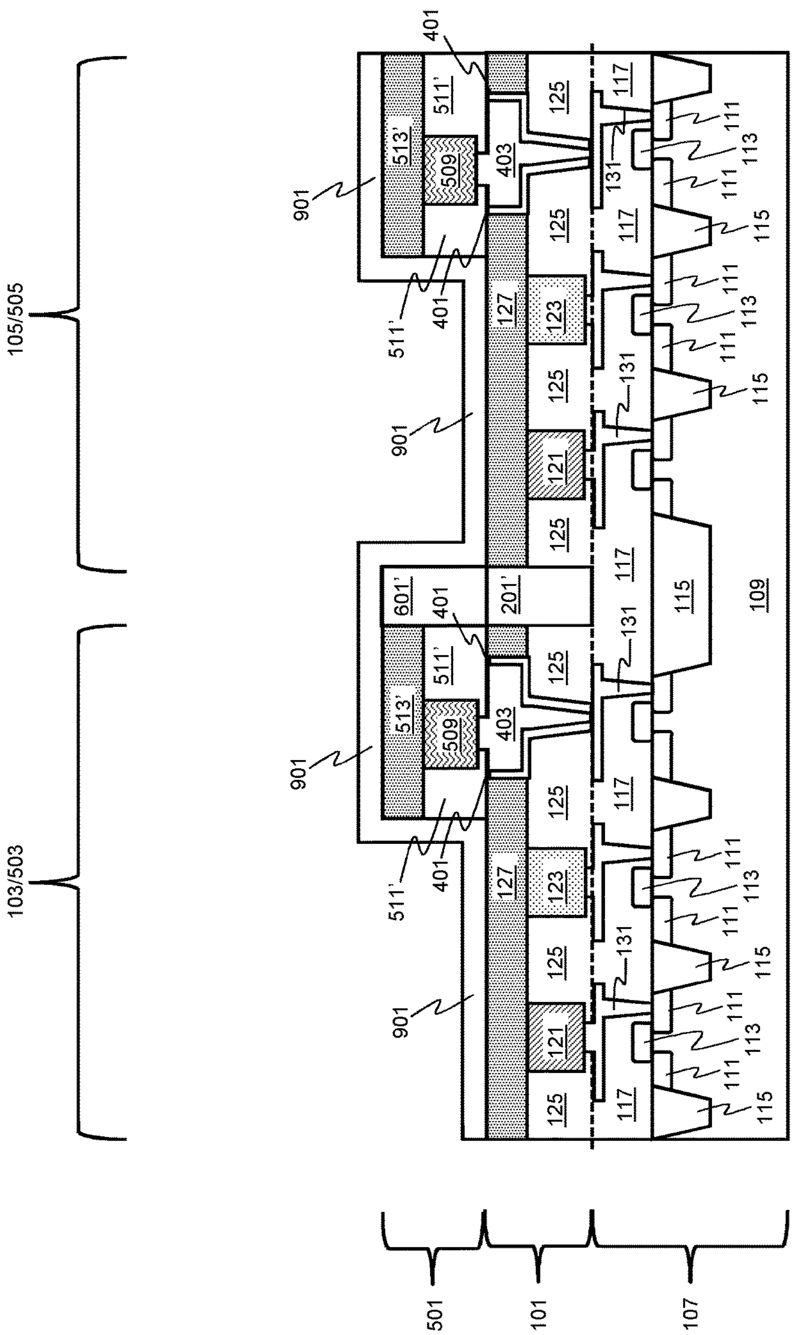
Figure 10:
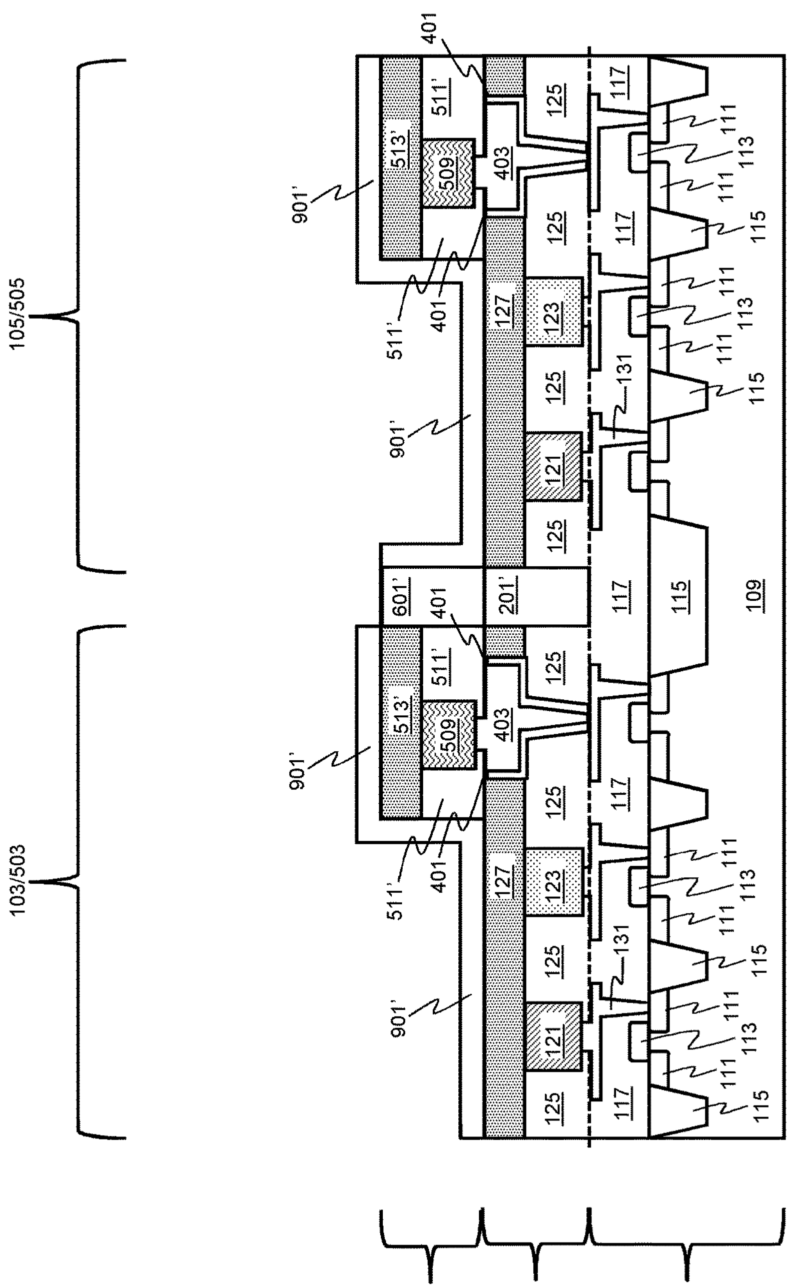
Figure 11:
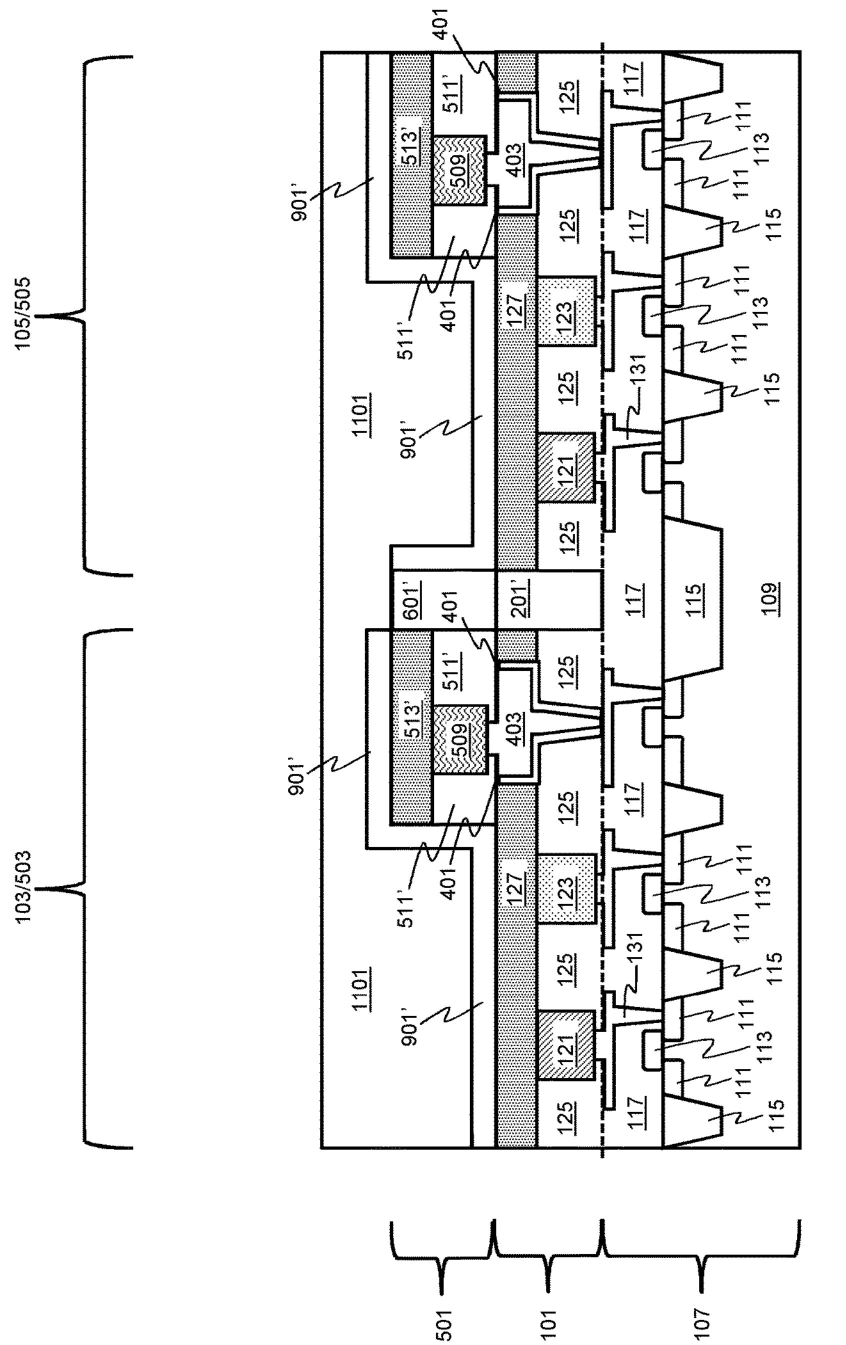
Figure 12:
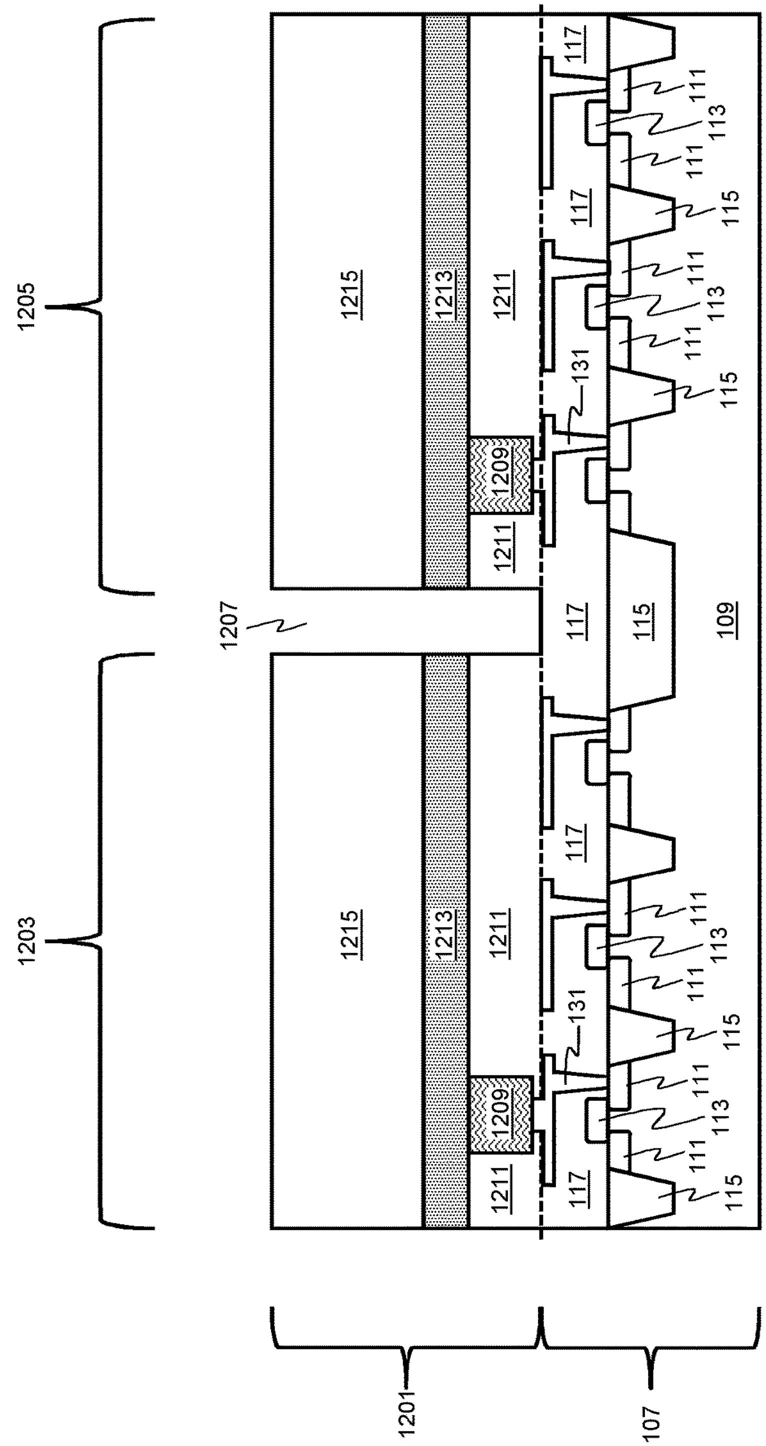
FIGS. 12 through 22 schematically illustrate cross-sectional views of a process flow for forming an integrated RGB LED and Si CMOS driver wafer, in accordance with another exemplary embodiment.

Adverting to FIG. 9, a conformal TCO layer 901 is formed, e.g., to a thickness of 100 nm to 150 nm, over the each color die 101 and 501. A portion of the TCO layer 901 may then be removed over the oxide 601' to make the subsequent dicing of the bonded dice 501 and 101 easier, thereby forming the TCO layer 901', as depicted in FIG. 10. Adverting to FIG. 11, a PECVD oxide layer 1101 is formed over the CMOS wafer 107, for example, to a thickness of 0.5 μm to 1 μm, e.g., at least above an upper surface of the TCO layer 901', and then planarized, e.g., by CMP, to complete the rest of the packaging process. Alternatively, the PECVD oxide layer 1101 may be formed over the CMOS wafer 107 without first removing a portion of the TCO layer 901.

FIGS. 12 through 22 schematically illustrate cross-sectional views of a process flow for forming an integrated RGB LED and Si CMOS driver wafer, in accordance with another exemplary embodiment. The process steps of FIGS. 12 through 22 are similar to the process steps of FIGS. 1 through 11, except each bottom color die in the bonded stack includes only 1 LED and each top color die includes two LEDs. Adverting to FIG. 12, a plurality of laterally separated color die 1201, e.g., color die 1203 and 1205, are bonded to the CMOS wafer 107 of FIG. 1. Similar to the color die 101 of FIG. 1, each color die 1201 is a KGD and is laterally separated from each other color die 1201 by a trench 1207. Also similar to each color die 501 of FIG. 5, each color die 1201 includes one LED 1209 within an oxide layer 1211, a GaN or GaP buffer layer 1213, and a substrate 1215, e.g., formed of Si, sapphire, or SiC, and each LED 1209 is electrically connected to the CMOS wafer 107 via a metal contact 131. In the instance where the LED 1209 is red, each color die 1201 includes an AlInGaP LED 1209 and a GaP buffer layer 1213, but in the instance where the LED 1209 is blue or green, each color die 1201 includes an InGaN LED 1209 and a GaN buffer layer 1213. By way of example, and not by way of limitation, the LED 1209 is red in this instance and, therefore, each color die 501 includes an AlInGaP LED 1209 and a GaP buffer layer 1213.

Figure 13:
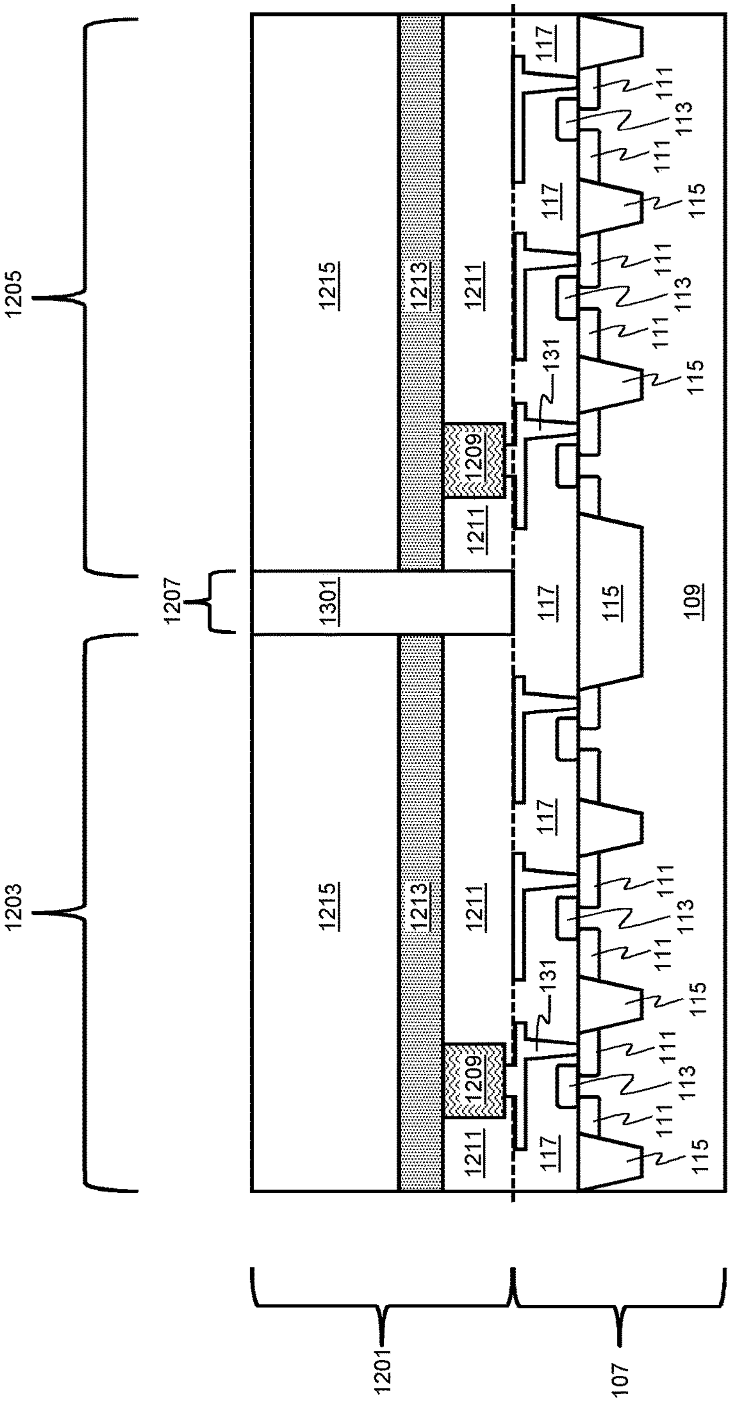
Figure 14:
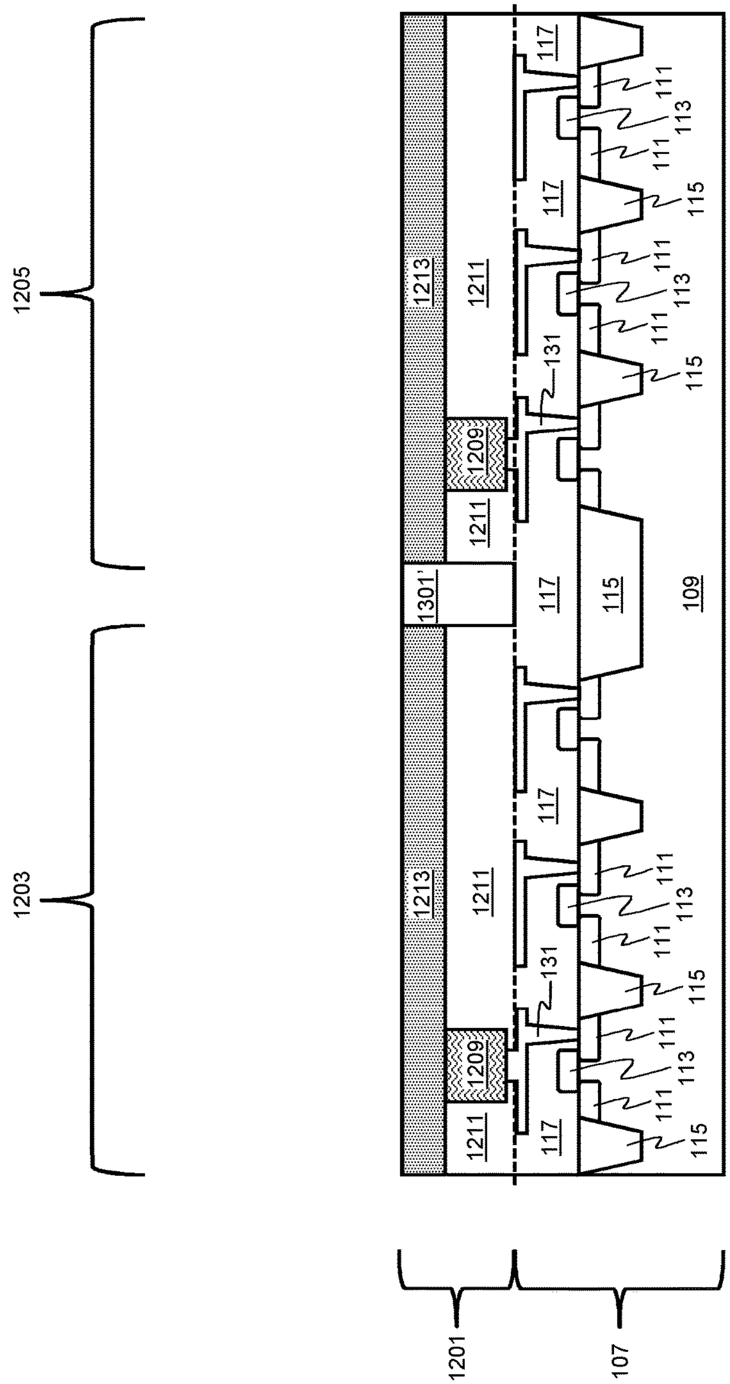
Figure 15:
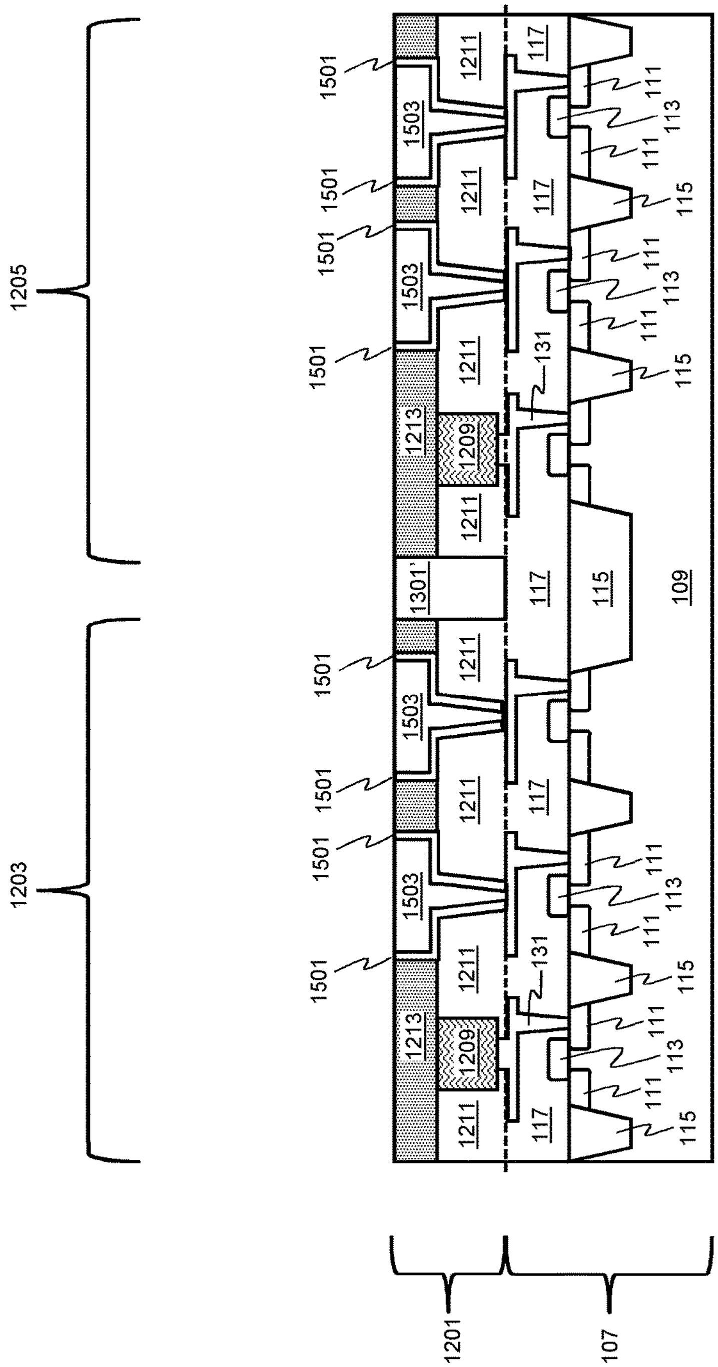

Next, the trench 1207 is filled with an oxide 1301, e.g., formed of spin-on glass or LT-PECVD, and the oxide 1301 is planarized, e.g., by CMP, down to the substrate 1215, as depicted in FIG. 13. Adverting to FIG. 14, the oxide 1301 and the substrate 1215 are planarized, e.g., by CMP, down to the GaP or GaN buffer layer 1213, forming the oxide 1301'. Two contact holes (not shown for illustrative convenience) are then formed through the GaP or GaN buffer and oxide layers 1213 and 1211, respectively; a conformal nitride liner 1501 is formed on the sidewalls of each contact hole; each contact hole is filled with a metal 1503, e.g., Cu, W, or Al; and the metal 1503 is planarized, e.g., by CMP, down to the GaP or GaN buffer layer 1213, as depicted in FIG. 15.

Figure 16:
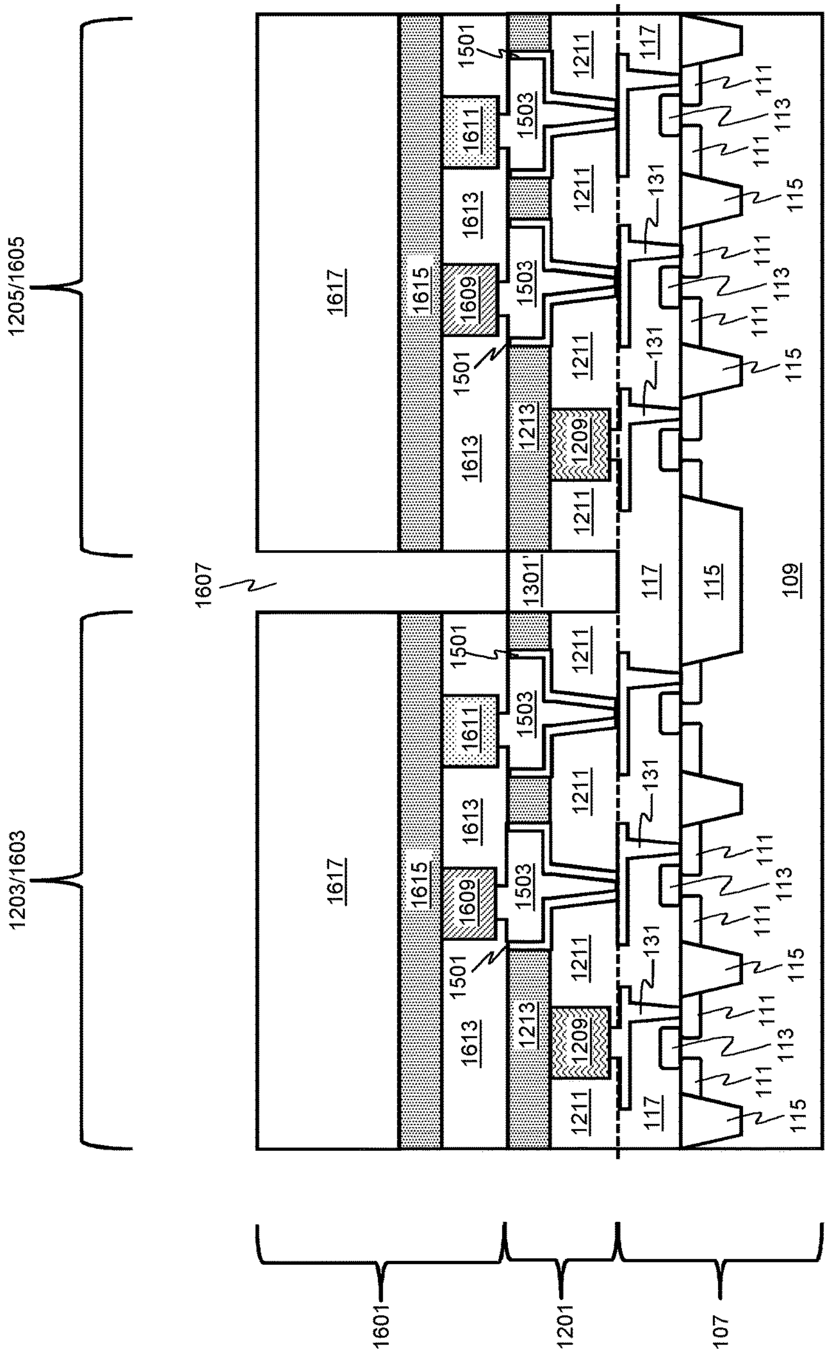

Adverting to FIG. 16, a plurality of color die 1601, e.g., color die 1603 and 1605, are each bonded to a color die 1201, e.g., color die 1203 and 1205, respectively. Like color die 1201, each color die 1601 is a KGD and is laterally separated from each other color die 1601 by a trench 1607. Similar to the color die 101 of FIG. 1, each color die 1601 includes two laterally separated LEDs 1609 and 1611, e.g., formed of InGaN, within an oxide layer 1613, a GaN buffer layer 1615, and a substrate 1617, e.g., formed of Si, sapphire, or SiC. Similar to the LEDs 121 and 123 of FIG. 1, the LEDs 1609 and 1611 may be blue and green, green and red, or blue and red. By way of example, and not by way of limitation, the LEDs 1609 and 1611 in this instance are blue and green, respectively, or vice-versa.

Figure 17:
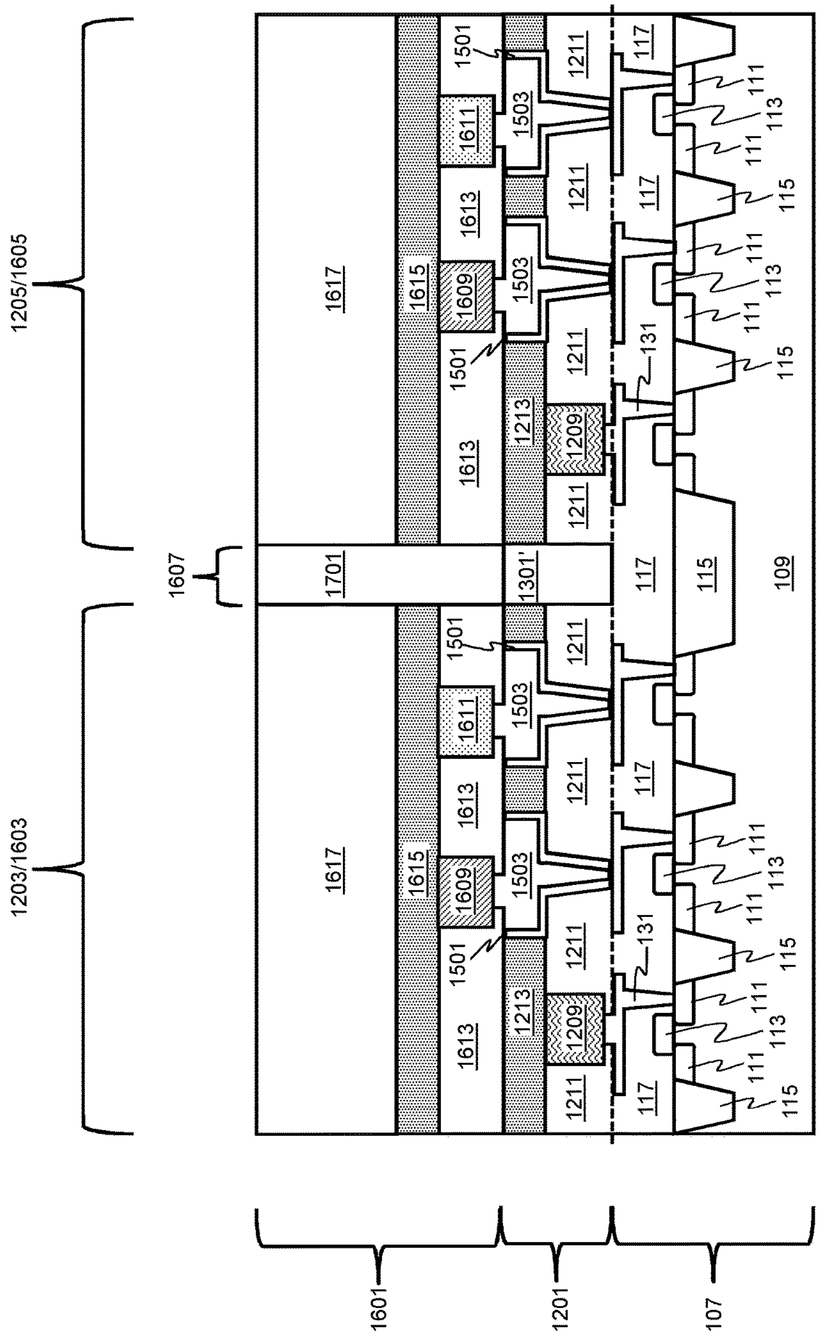
Figure 18:
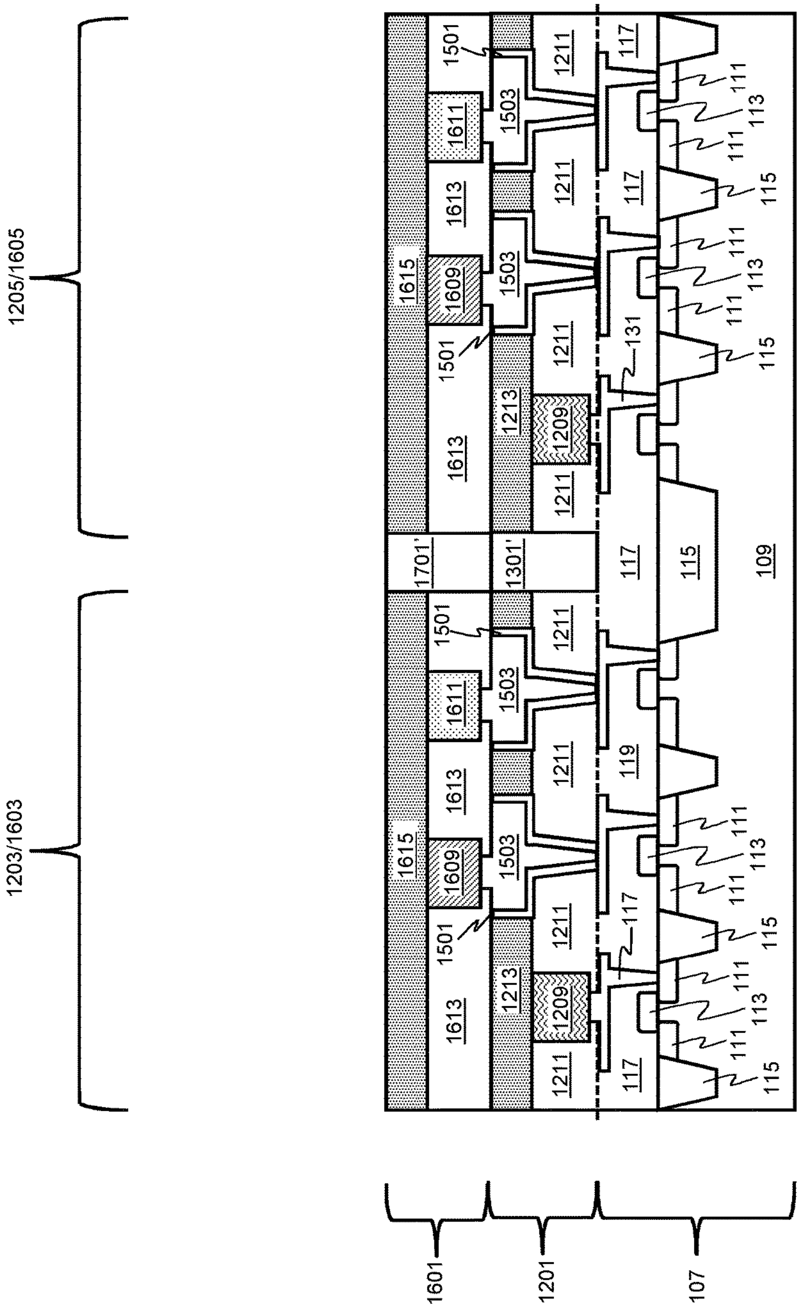
Figure 19:
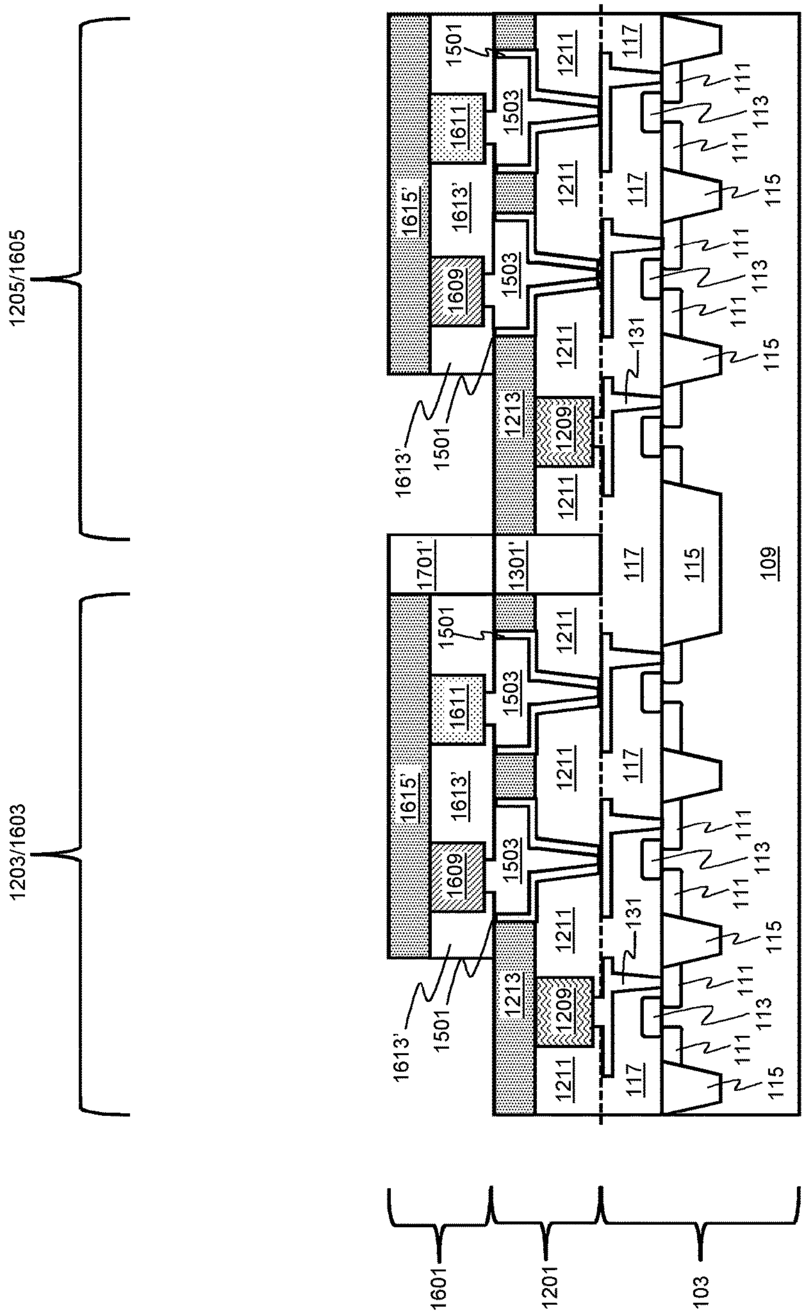

Next, the trench 1607 is filled with an oxide 1701, e.g., formed of spin-on glass or LT-PECVD, and the oxide 1701 is planarized, e.g., by CMP, down to the substrate 1617, as depicted in FIG. 17. Adverting to FIG. 18, the oxide 1701 and the substrate 1617 are then planarized, e.g., by CMP, down to the GaN buffer layer 1615, forming the oxide 1701'. A portion of each color die 1601 is then removed to expose a portion of each bonded color die 1201 below, as depicted in FIG. 19. The portion of each color die 1601 may be removed, e.g., by forming a mask (not shown for illustrative convenience) over the LEDs 1609 and 1611 of each color die 1601, the oxide 1701', and portions of the GaN buffer layer 1615 and oxide layer 1613 on opposite sides of the LEDs 1609 and 1611. The exposed portion of the GaN buffer layer 1615 and oxide layer 1611 is then etched, e.g., by a dry etch or an ICP etch, down to the GaP or GaN buffer layer 1213 of each color die 1201, forming the GaN buffer and oxide layers 1615' and 1613', respectively.

Figure 20:
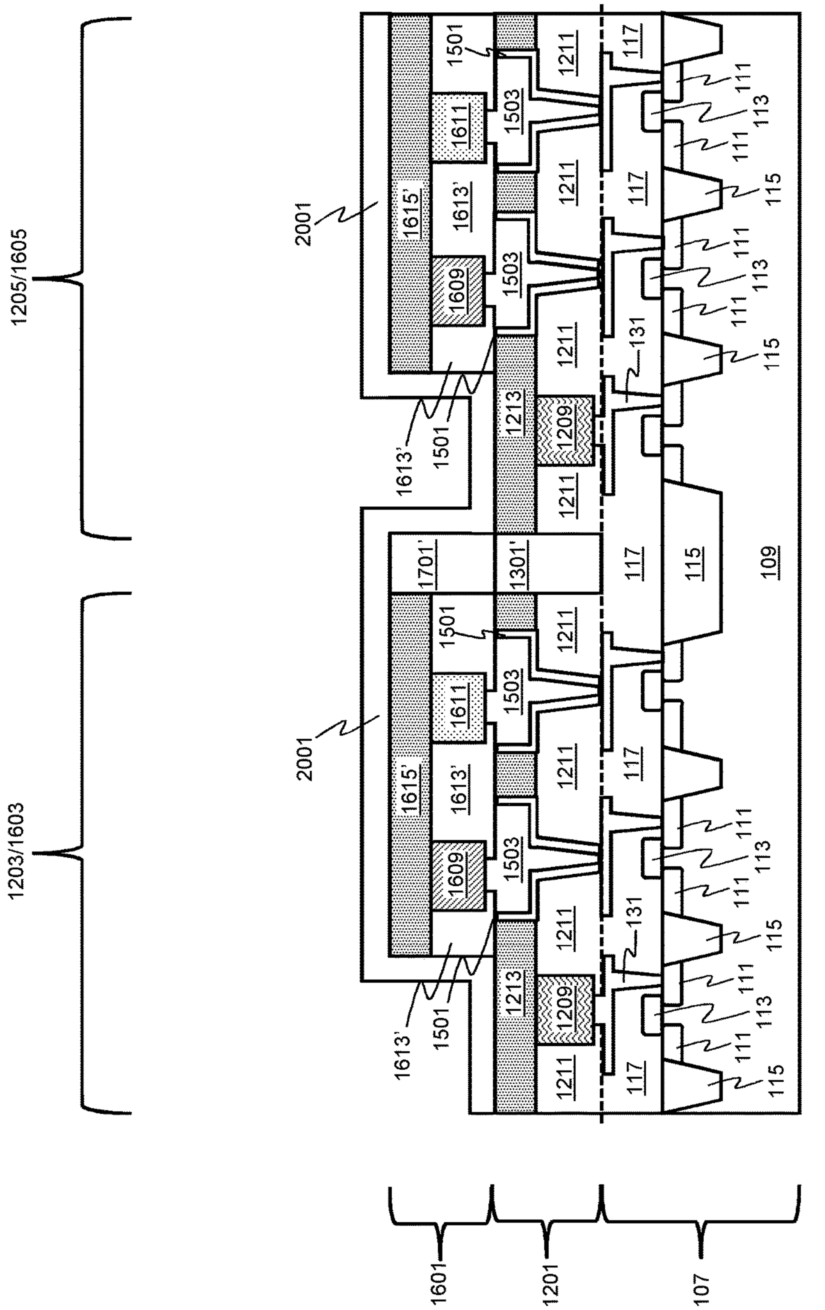
Figure 21:
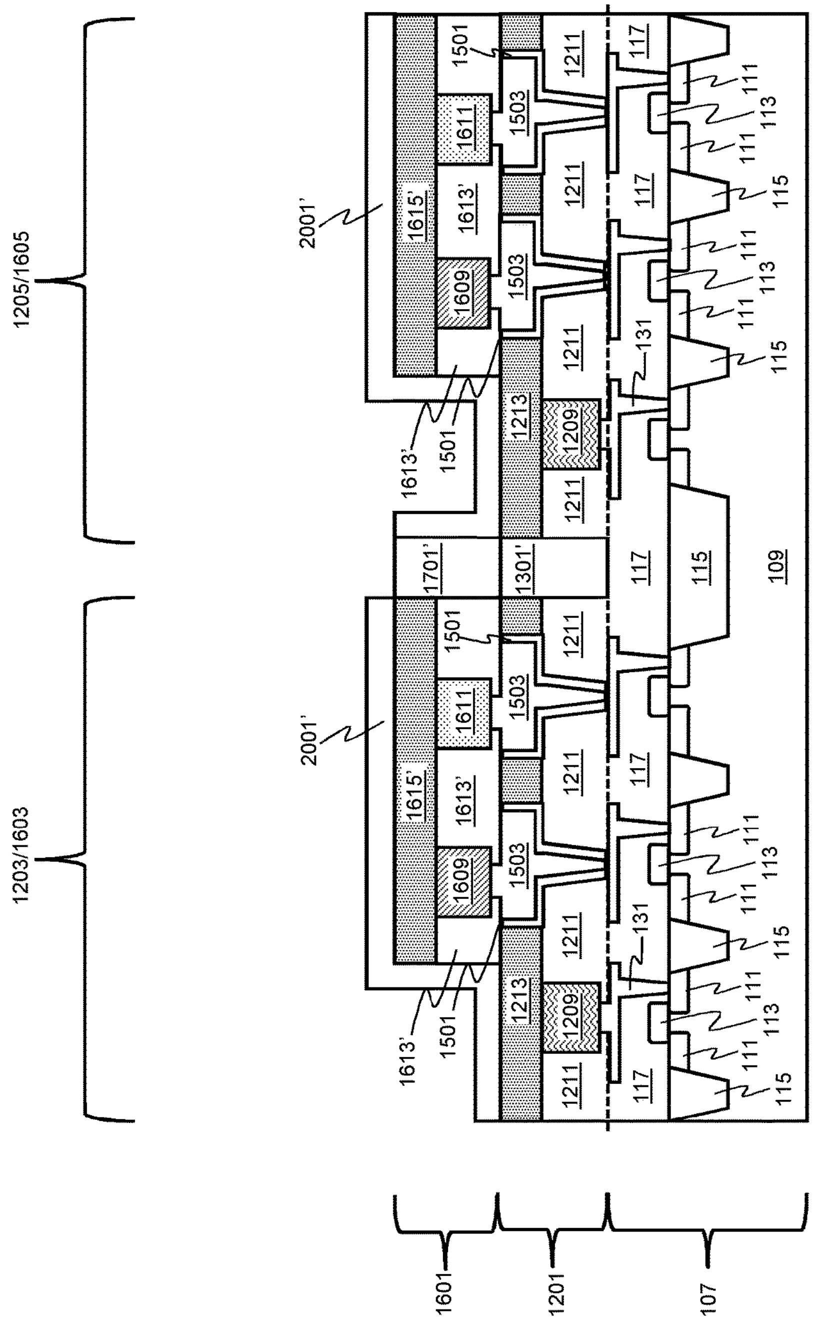
Figure 22:
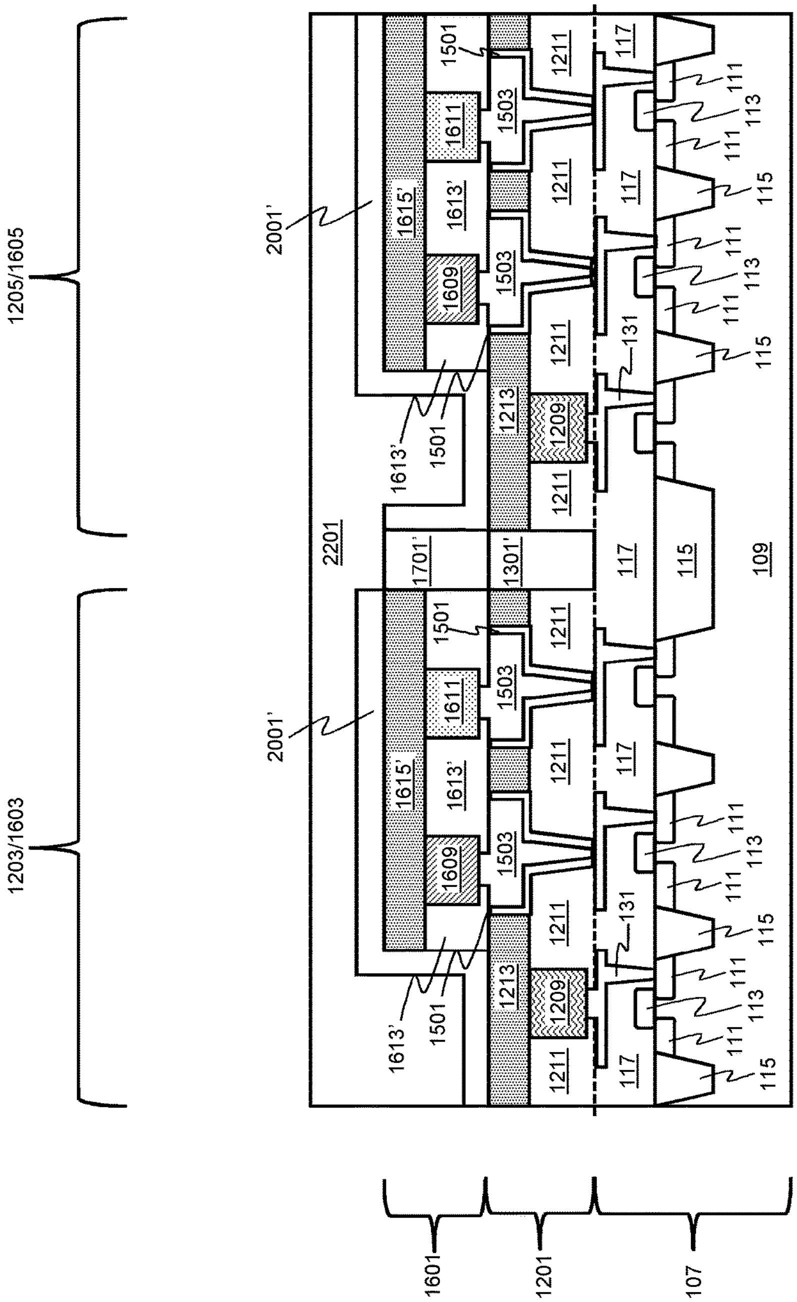

Adverting to FIG. 20, a conformal TCO layer 2001 is formed, e.g., to a thickness of 100 nm to 150 nm, over each color die 1201 and 1601. A portion of the TCO layer 2001 may then be removed over the oxide 1701' to make the subsequent dicing of the bonded color dies 1601 and 1201 easier, thereby forming the TCO layer 2001', as depicted in FIG. 21. Adverting to FIG. 22, a PECVD oxide layer 2201 is formed over the CMOS wafer 107, for example, to a thickness of 0.5 μm to 1 μm, e.g., at least above an upper surface of the TCO layer 2201', and then planarized, e.g., by CMP, to complete the rest of the packaging process. Alternatively, the PECVD oxide layer 2201 may be formed over the CMOS wafer 107 without first removing a portion of the TCO layer 2201.

Figure 23:
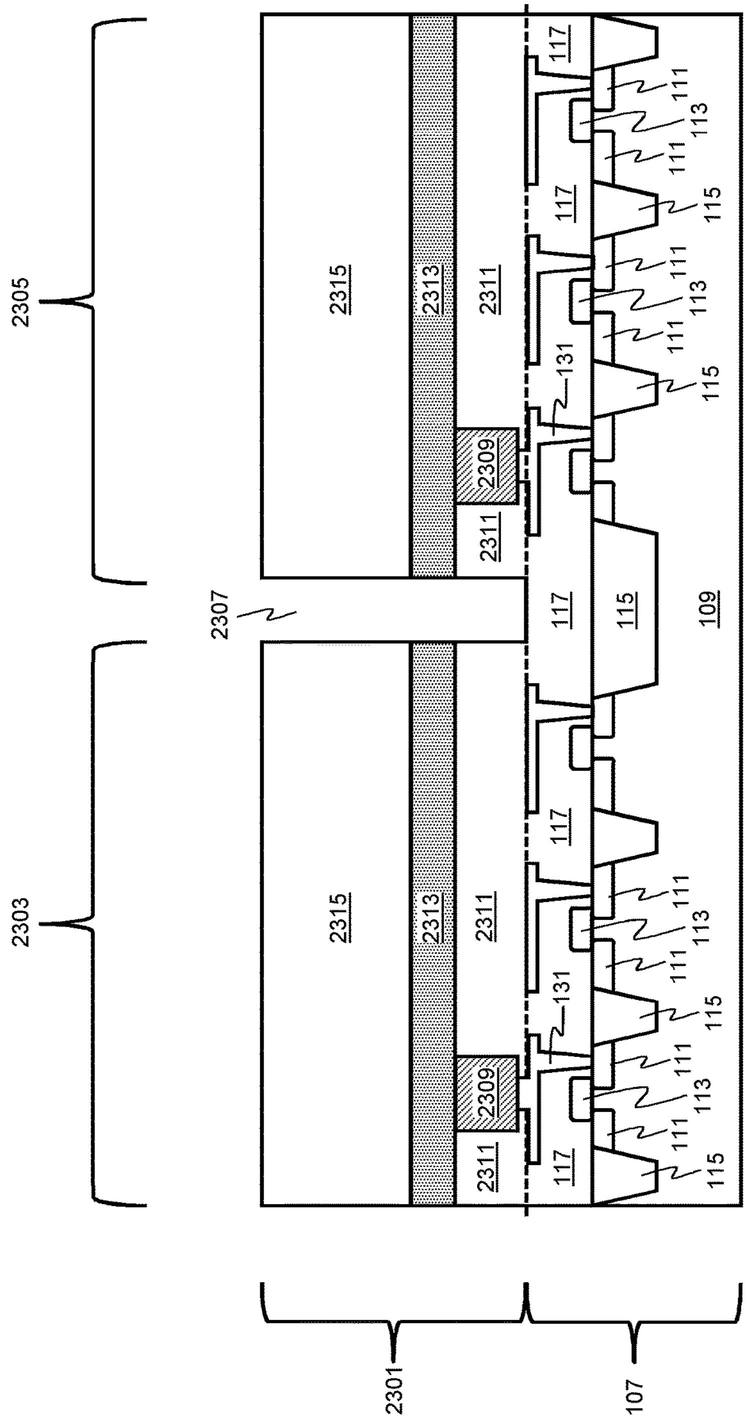
FIGS. 23 through 38 schematically illustrate cross-sectional views of a process flow for forming an integrated RGB LED and Si CMOS driver wafer, in accordance with a further exemplary embodiment.

FIGS. 23 through 38 schematically illustrate cross-sectional views of a process flow for forming an integrated RGB LED and Si CMOS driver wafer, in accordance with a further exemplary embodiment. The process steps of FIGS. 23 through 38 are also similar to the process steps of FIGS. 1 through 11 and FIGS. 12 through 22, except each stacked color die in this instance includes only 1 LED. Adverting to FIG. 23, a plurality of laterally separated color die 2301, e.g., color die 2303 and 2305, are bonded to the CMOS wafer 107 of FIG. 1, which again includes a substrate 109, S/D regions 111, gates 113, STI structures 115, and an oxide layer 117. Similar to color die 101 of FIG. 1, each color die 2301 is a KGD and is laterally separated by a trench 2307. Similar to color die 1201 of FIG. 12, each color die 2301 includes one LED 2309 within an oxide layer 2311, a GaN or GaP buffer layer 2313, and a substrate 2315, e.g., formed of Si, sapphire, or SiC, and each LED 2309 is electrically connected to the CMOS wafer 107 via a metal contact 131. In the instance where the LED 2309 is blue or green, each color die 2301 includes an InGaN LED 1209 and a GaN buffer layer 2313, but in the instance where the LED 2309 is red, each color die 2301 includes an AlInGaP LED 2309 and a GaP buffer layer 2313. By way of example, and not by way of limitation, the LED 2309 is blue in this instance and, therefore, each color die 2301 includes an InGaN LED 2309 and a GaN buffer layer 2313.

Figure 24:
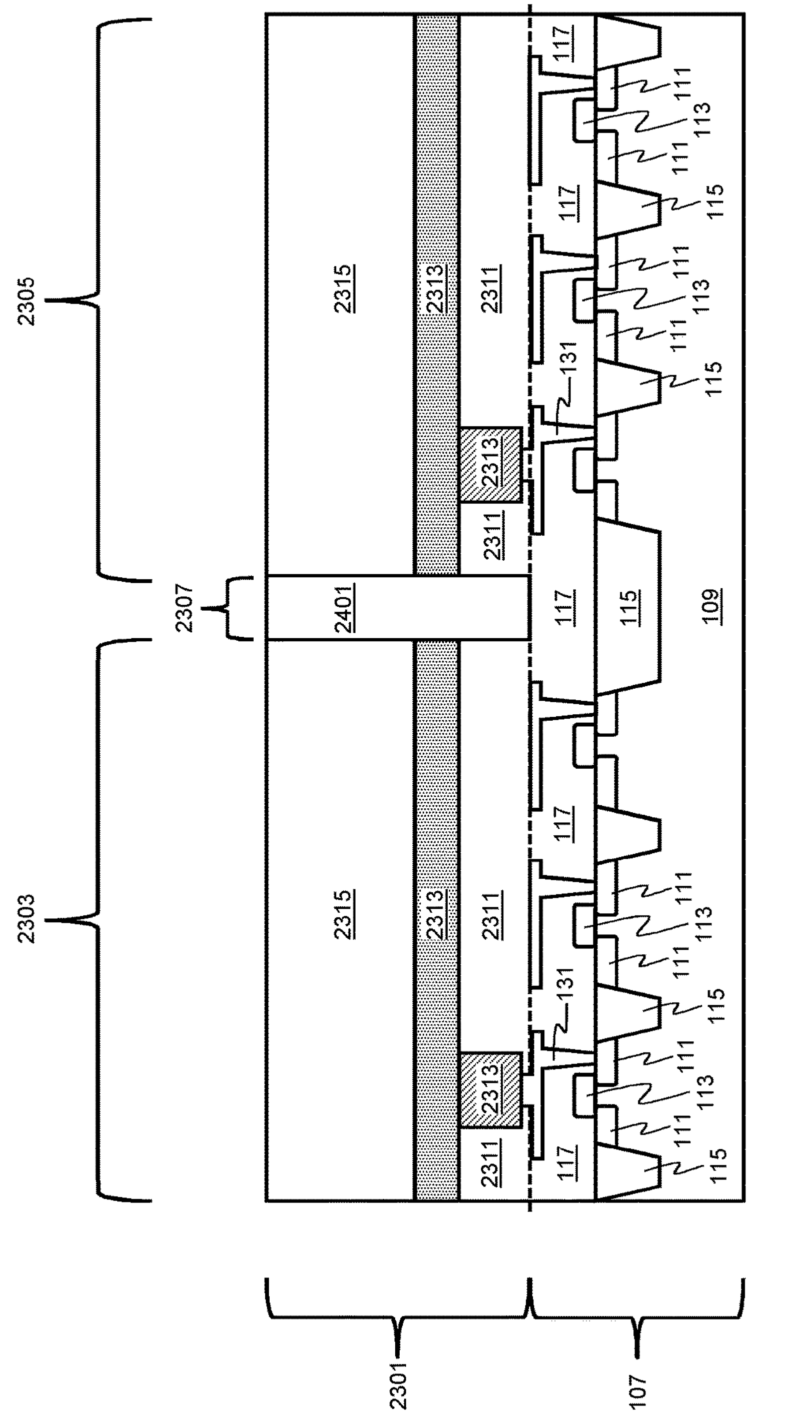
Figure 25:
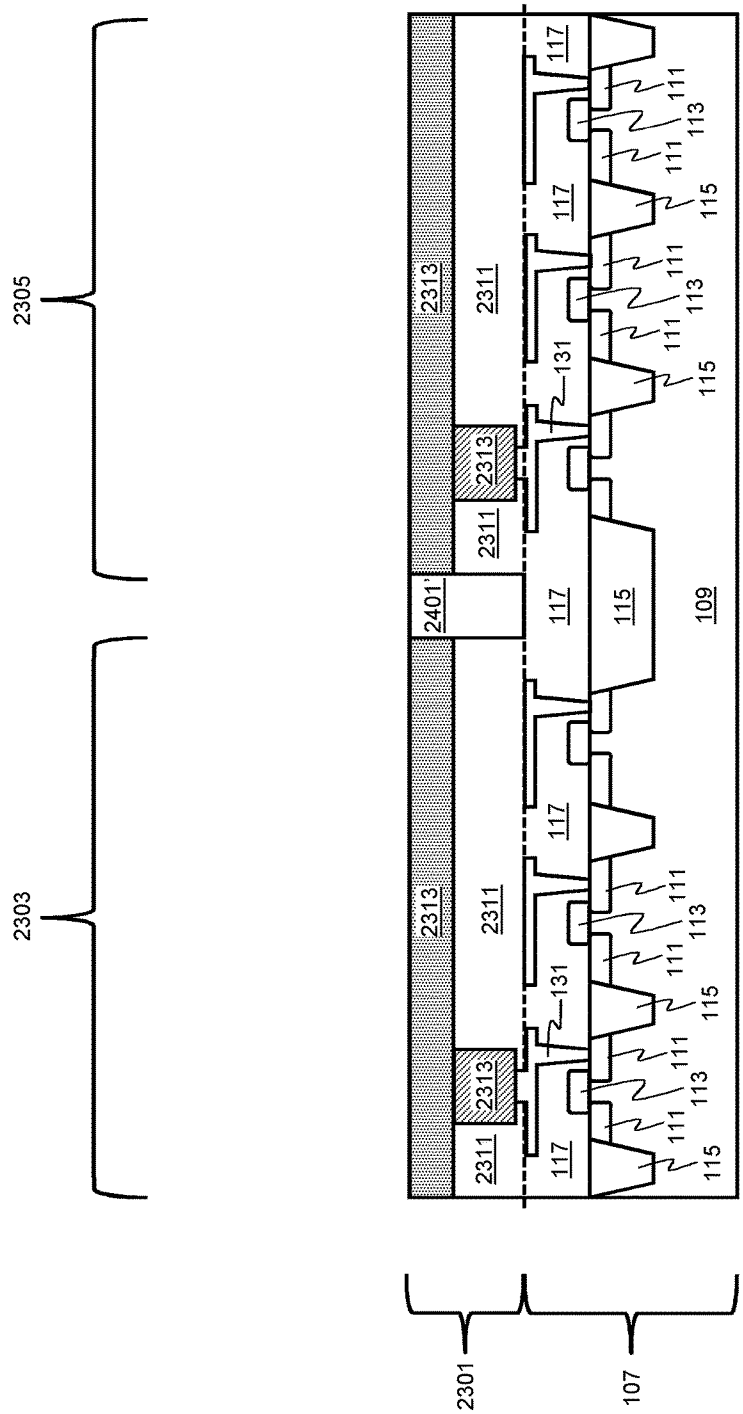
Figure 26:
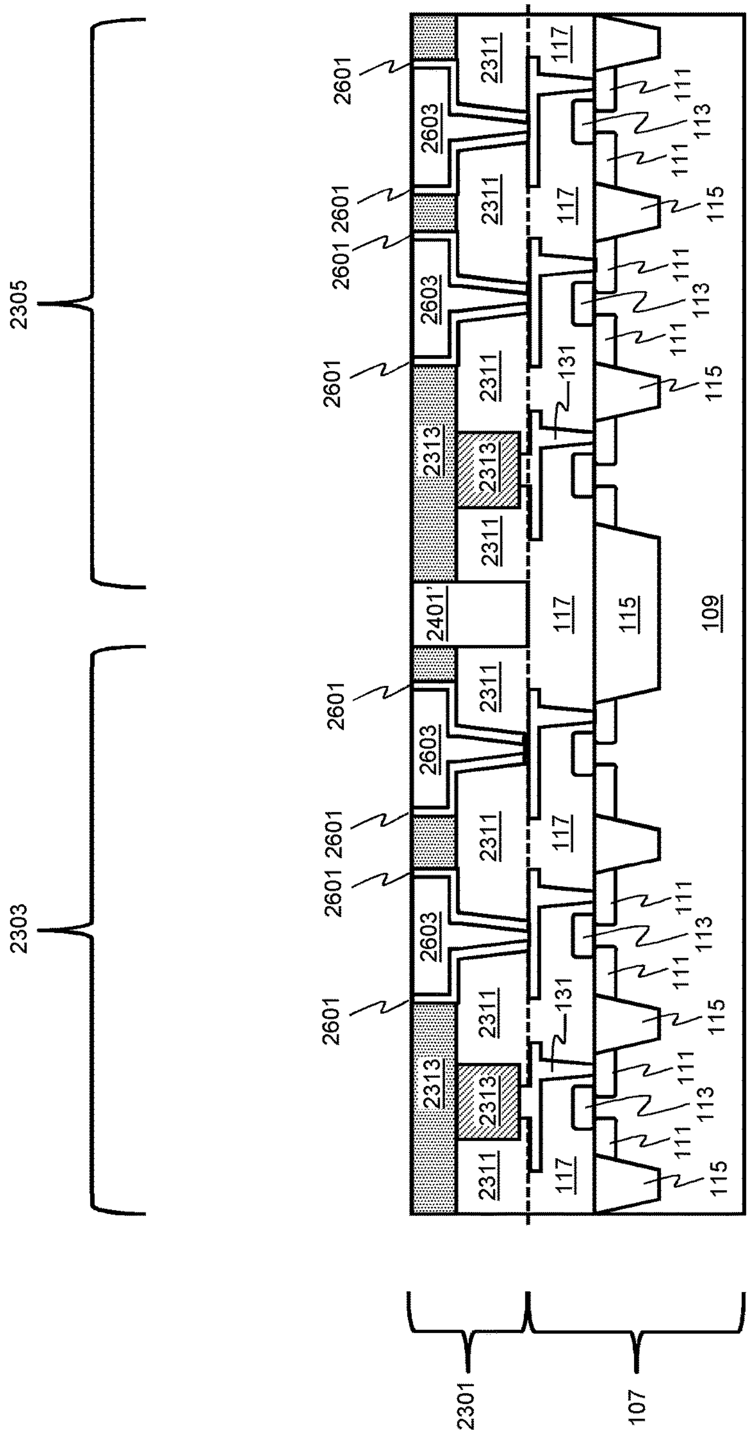

Next, the trench 2307 is filled with an oxide 2401, e.g., formed of spin-on glass or LT-PECVD, and the oxide 2401 is planarized, e.g., by CMP, down to the substrate 2315, as depicted in FIG. 24. Adverting to FIG. 25, the oxide 2401 and the substrate 2315 are planarized, e.g., by CMP, down to the GaN or GaP buffer layer 2313, forming the oxide 2401'. Two contact holes (not shown for illustrative convenience) are then formed through the GaN or GaP buffer and oxide layers 2313 and 2311, respectively; a conformal nitride liner 2601 is formed on the sidewalls of each contact hole; each contact hole is filled with a metal 2603, e.g., Cu, W, or Al; and the metal 2603 is planarized, e.g., by CMP, down to the GaN or GaP buffer layer 2313, as depicted in FIG. 26.

Figure 27:
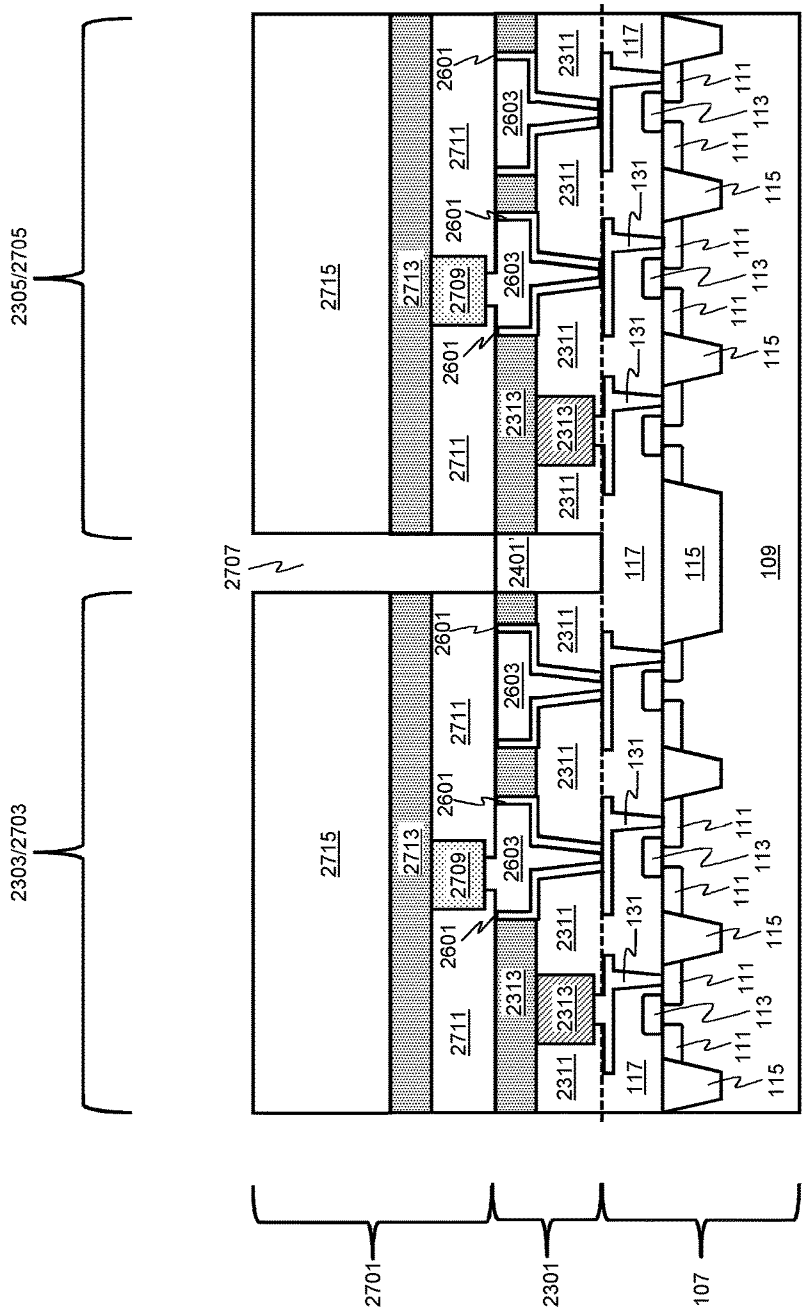

Adverting to FIG. 27, a plurality of color die 2701, e.g., color die 2703 and 2705, are each bonded to a color die 2301, e.g., color die 2303 and 2305, respectively. Each color die 2701 is also a KGD and is laterally separated by a trench 2707. Similar to each color die 2301, each color die 2701 includes one LED 2709 within an oxide layer 2711, a GaN or GaP buffer layer 2713, and a substrate 2715, e.g., formed of Si, sapphire, or SiC, and each LED 2709 is electrically connected to the CMOS wafer 107 via a metal contact 2603 and a metal contact 131. In the instance where the LED 2709 is blue or green, each color die 2701 includes an InGaN LED 2709 and a GaN buffer layer 2713, but in the instance where the LED 2709 is red, each color die 2701 includes an AlInGaP LED 2709 and a GaP buffer layer 2713. By way of example, and not by way of limitation, the LED 2709 is green in this instance and, therefore, each color die 2701 includes an InGaN LED 2709 and a GaN buffer layer 2713.

Figure 28:
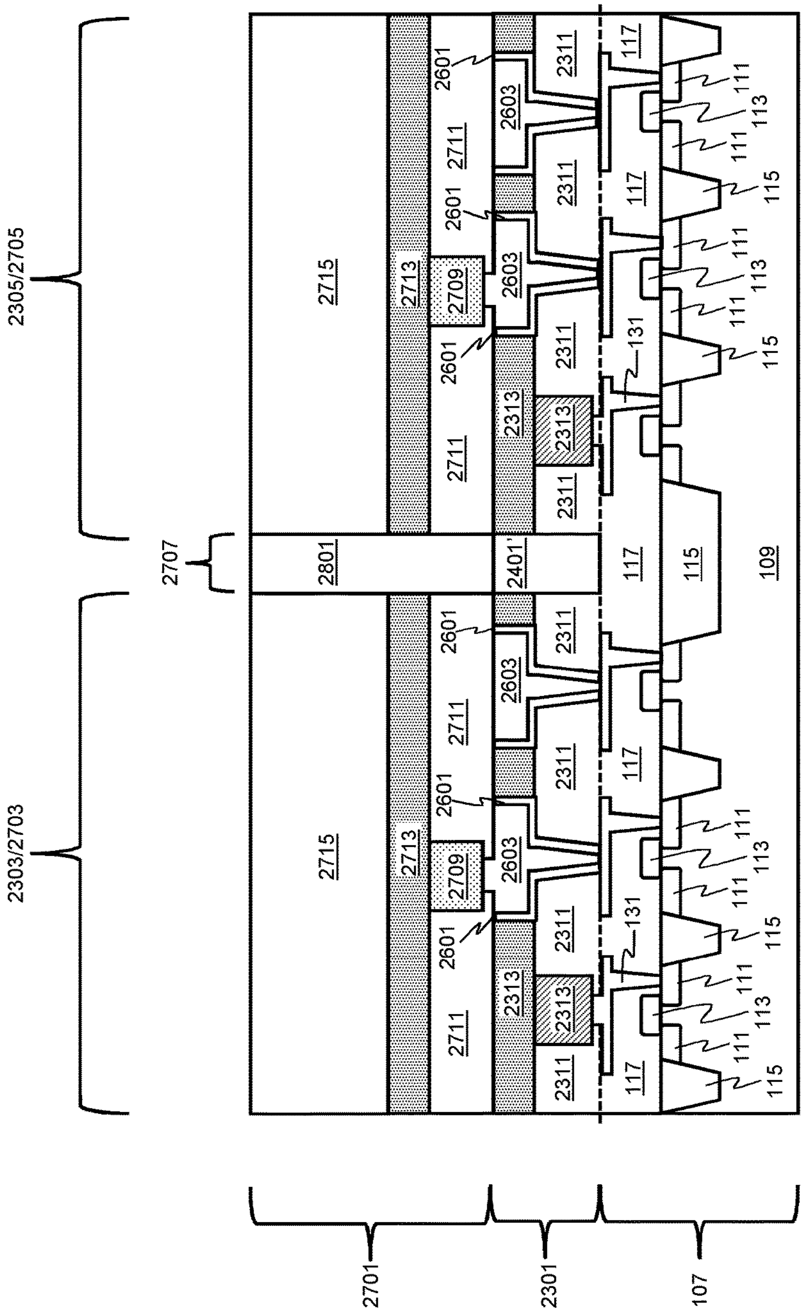
Figure 29:
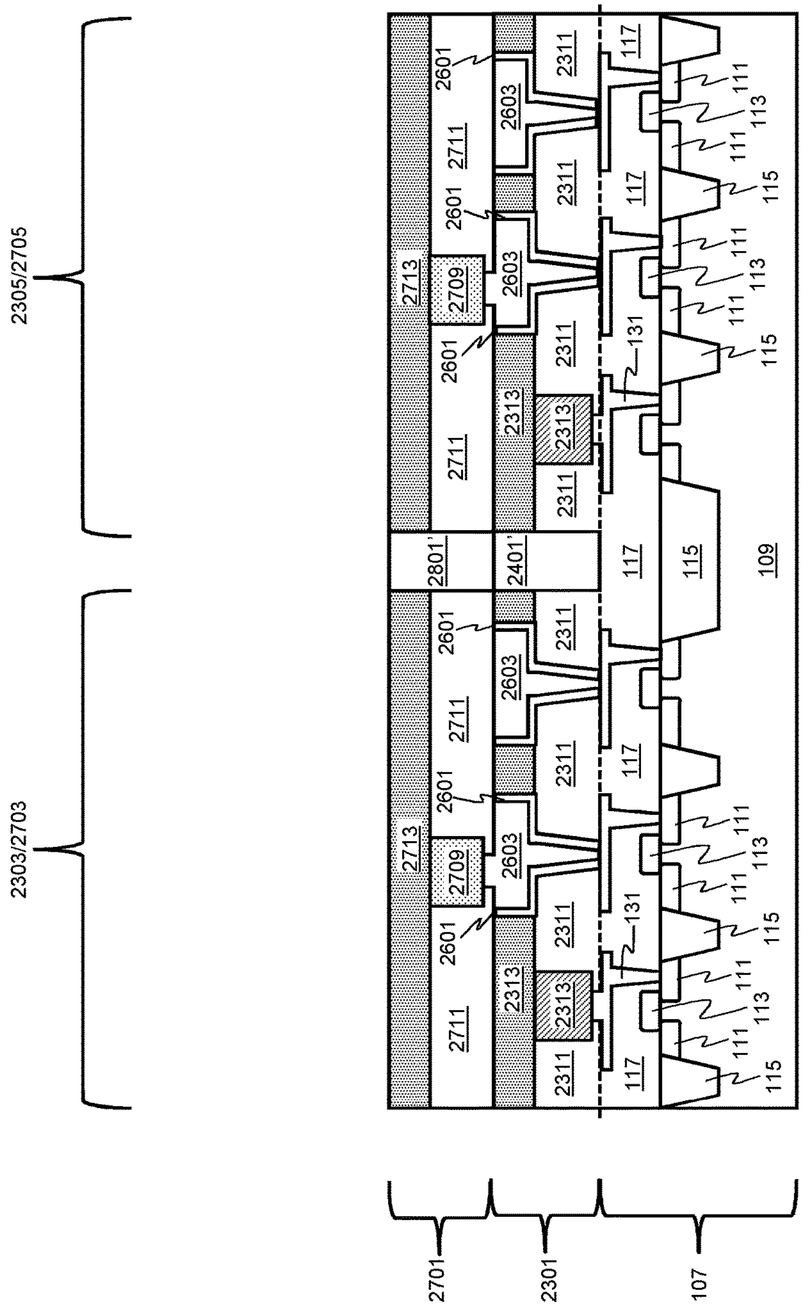
Figure 30:
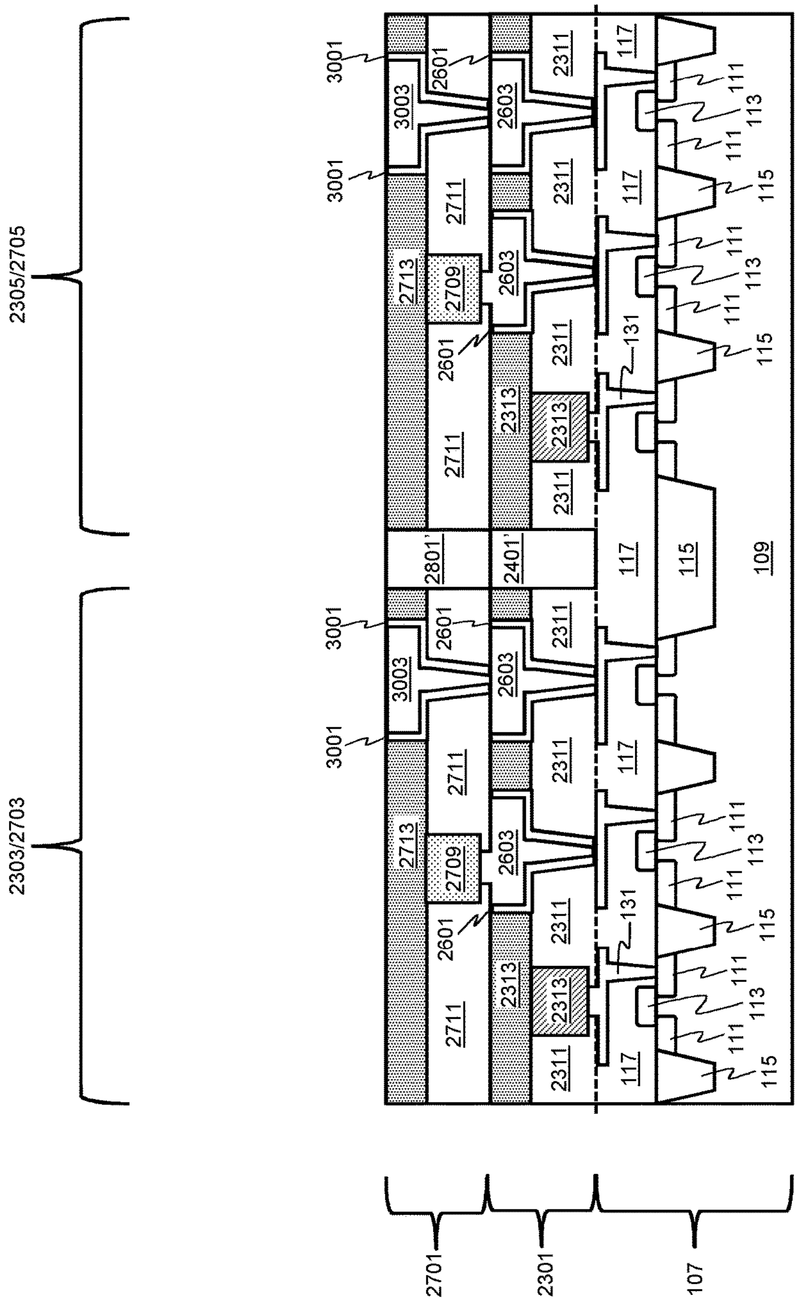

Next, the trench 2707 is filled with an oxide 2801, e.g., formed of spin-on glass or LT-PECVD, and the oxide 2801 is planarized, e.g., by CMP, down to the substrate 2715, as depicted in FIG. 28. Adverting to FIG. 29, the oxide 2801 and the substrate 2715 are planarized, e.g., by CMP, down to the GaN or GaP buffer layer 2713, forming the oxide 2801'. A contact hole (not shown for illustrative convenience) is then formed through the GaN or GaP buffer and oxide layers 2713 and 2711, respectively, over the available metal contact 2603; a conformal nitride liner 3001 is formed on the sidewalls of each contact hole; each contact hole is filled with a metal 3003, e.g., Cu, W, or Al; and the metal 3003 is planarized, e.g., by CMP, down to the GaN or GaP buffer layer 2713, as depicted in FIG. 30.

Figure 31:
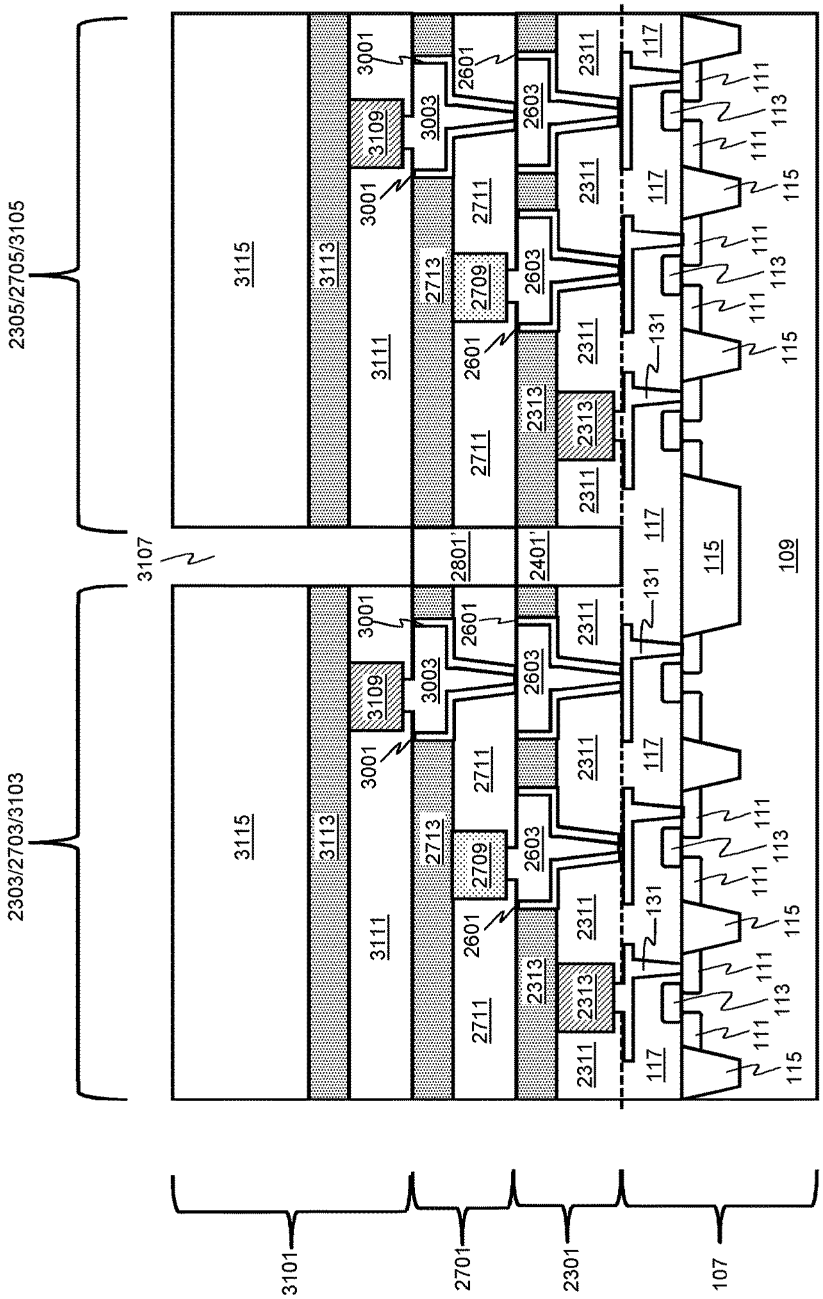

Adverting to FIG. 31, a plurality of color die 3101, e.g., color die 3103 and 3105, are each bonded to a color die 2701, e.g., color die 2703 and 2705, respectively. Each color die 3101 is also a KGD and is laterally separated by a trench 3107. Similar to each color die 2701, each color die 3101 includes one LED 3109 within an oxide layer 3111, a GaN or GaP buffer layer 3113, and a substrate 3115, e.g., formed of Si, sapphire, or SiC, and each LED 3109 is electrically connected to the CMOS wafer 107 via the metal contacts 3003, 2603, and 131, respectively. In the instance where the LED 3109 is red, each color die 3101 includes an AlInGaP LED 3109 and a GaP buffer layer 3113, but in the instance where the LED 3109 is blue or green, each color die 3101 includes an InGaN LED 3109 and a GaN buffer layer 3113. By way of example, and not by way of limitation, the LED 3109 is red in this instance and, therefore, each color die 3101 includes an AlInGaP LED 3109 and a GaP buffer layer 3113.

Figure 32:
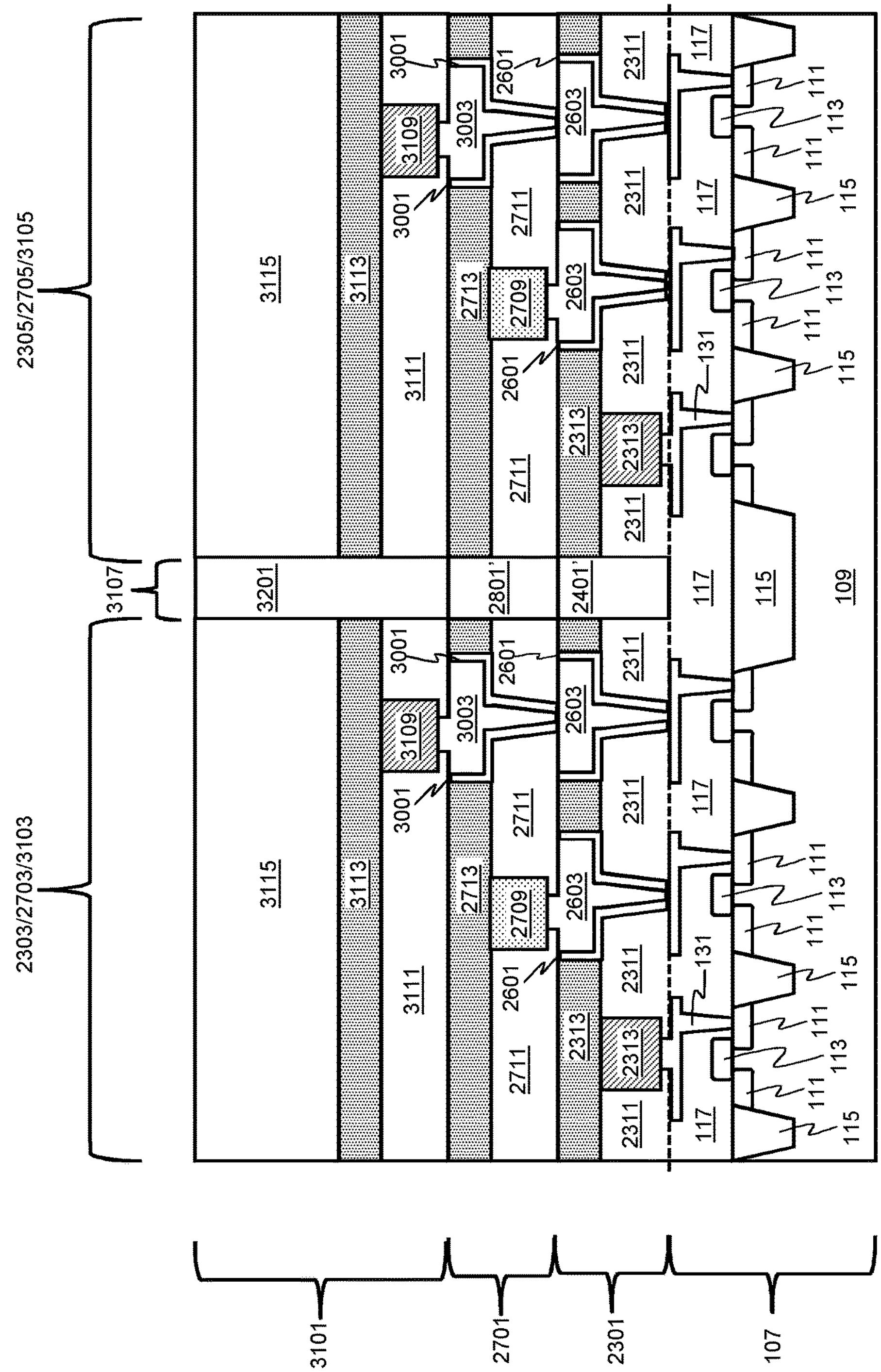
Figure 33:
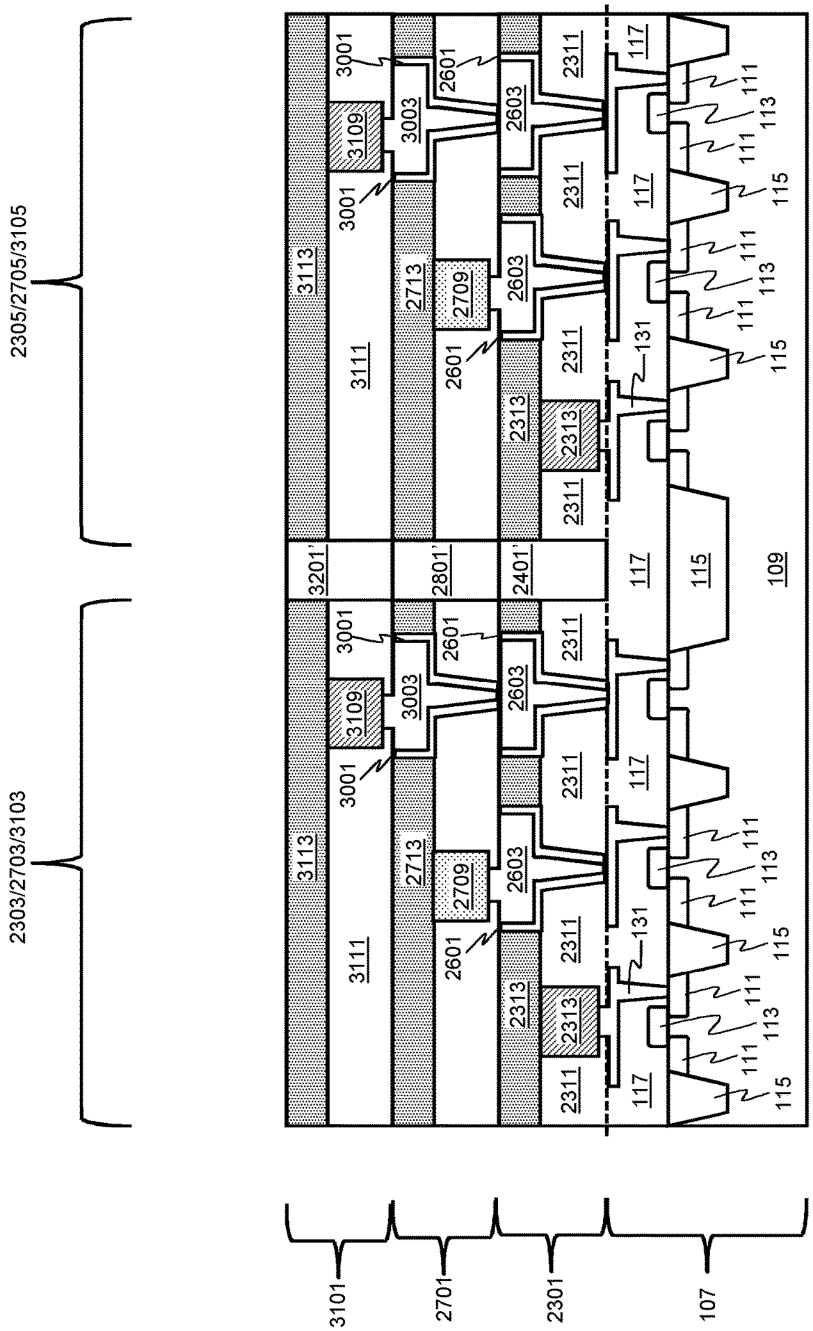

Next, the trench 3107 is filled with an oxide 3201, e.g., formed of spin-on glass or LT-PECVD, and the oxide 3201 is planarized, e.g., by CMP, down to the substrate 3115, as depicted in FIG. 32. Adverting to FIG. 33, the oxide 3201 and the substrate 3115 are then planarized, e.g., by CMP, down to the GaP or GaN buffer layer 3113, forming the oxide 3201'.

Figure 34:
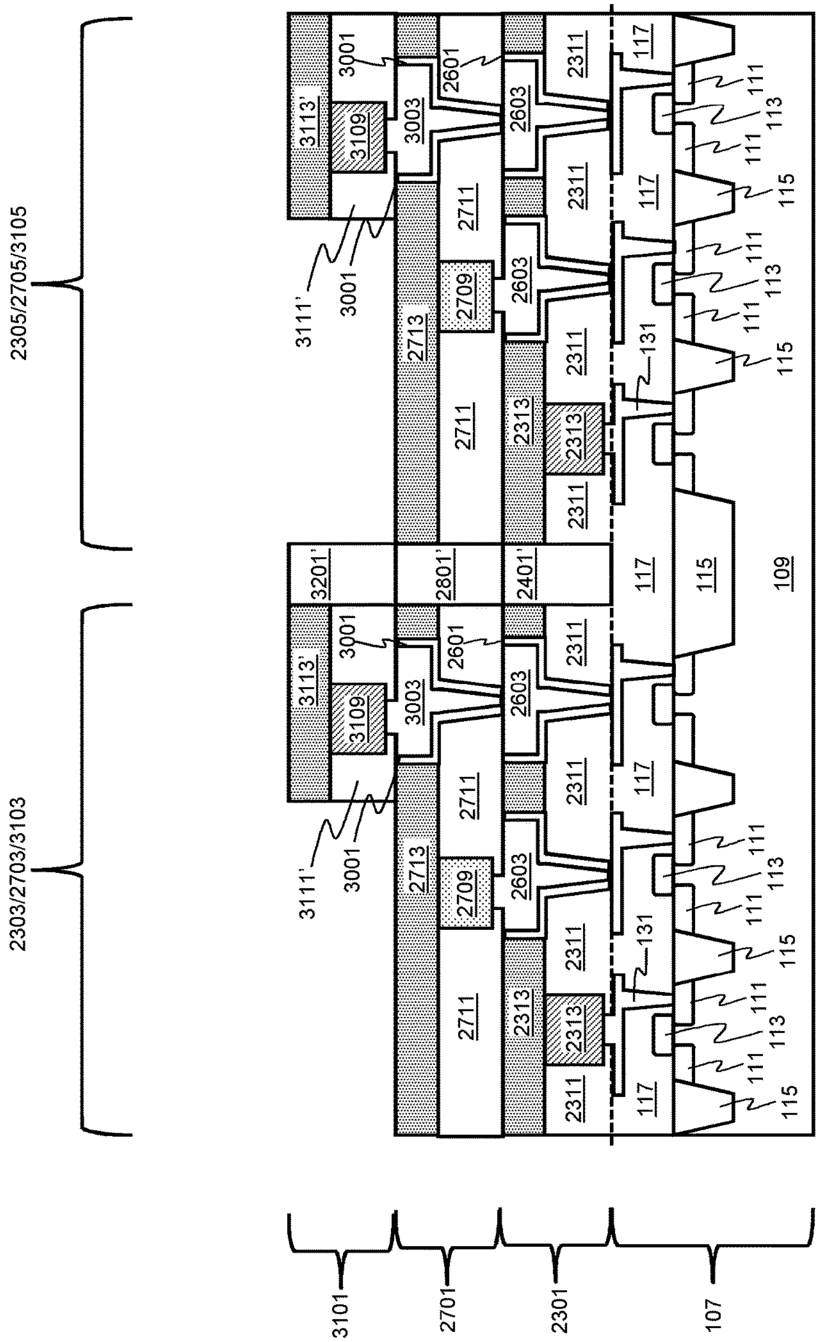

Adverting to FIG. 34, a portion of each color die 3101 is removed to expose a portion of each bonded color die 2701 below. The portion of each color die 3101 may be removed, e.g., by forming a mask (not shown for illustrative convenience) over the LED 3109 of each color die 3101, the oxide 3201', and portions of the GaP or GaN buffer and oxide layers 3113 and 3111, respectively, on opposite sides of the LED 3109. The exposed portion of the GaP or GaN buffer layer 3113 and oxide layer 3111 is then etched, e.g., by a dry etch or an ICP etch, down to the GaN or GaP buffer layer 2713 of each color die 2701, forming the GaP or GaN buffer and oxide layers 3113' and 3111', respectively.

Figure 35:
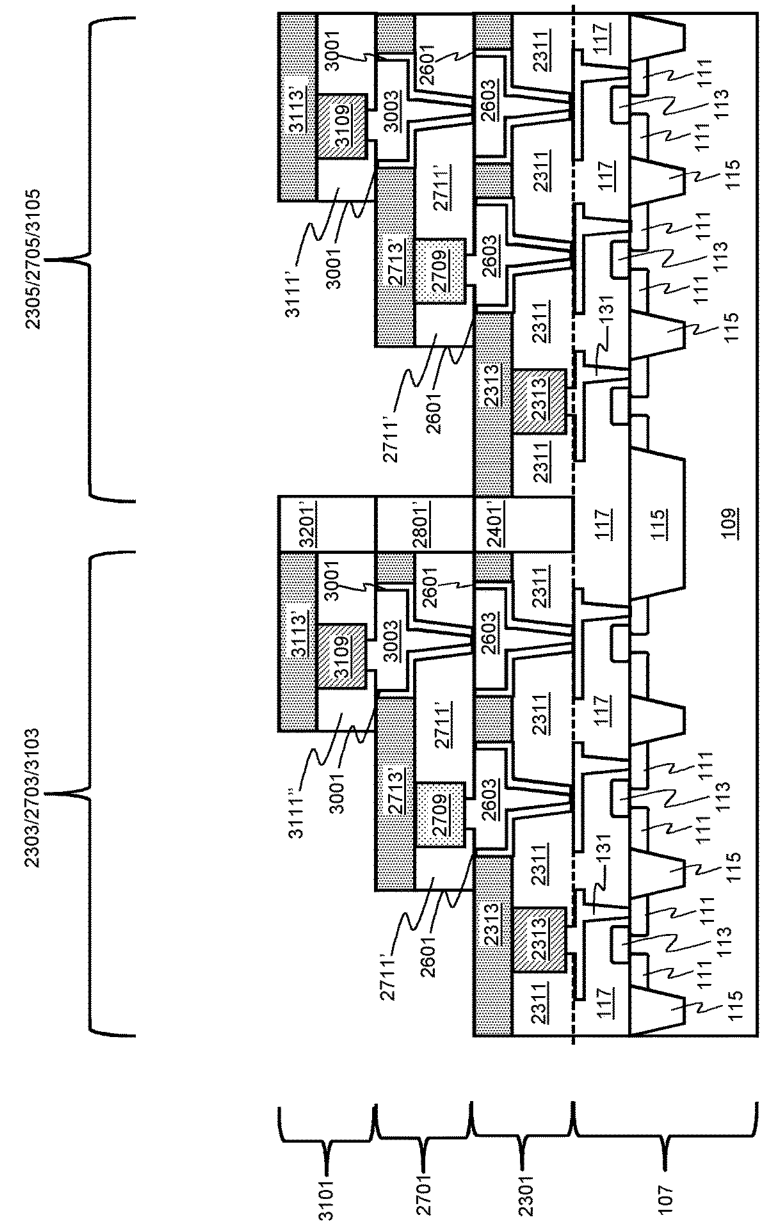

A second mask (not shown for illustrative convenience) may then be formed over the LEDs 3109 and 2709 of each color die 3101 and 2701, respectively, the oxide 3201', the GaP or GaN buffer layer 3113' and oxide layer 3111', and portions of the GaP or GaN buffer and oxide layers 2713 and 2711, respectively, on opposite sides of the LED 2709. The exposed portion of the GaP or GaN buffer layer 2713 and oxide layer 2711 is then etched, e.g., by a dry etch or an ICP etch, down to the GaN or GaP buffer layer 2313 of each color die 2301, forming the GaN or GaP buffer and oxide layers 2713' and 2711', respectively, as depicted in FIG. 35.

Figure 36:
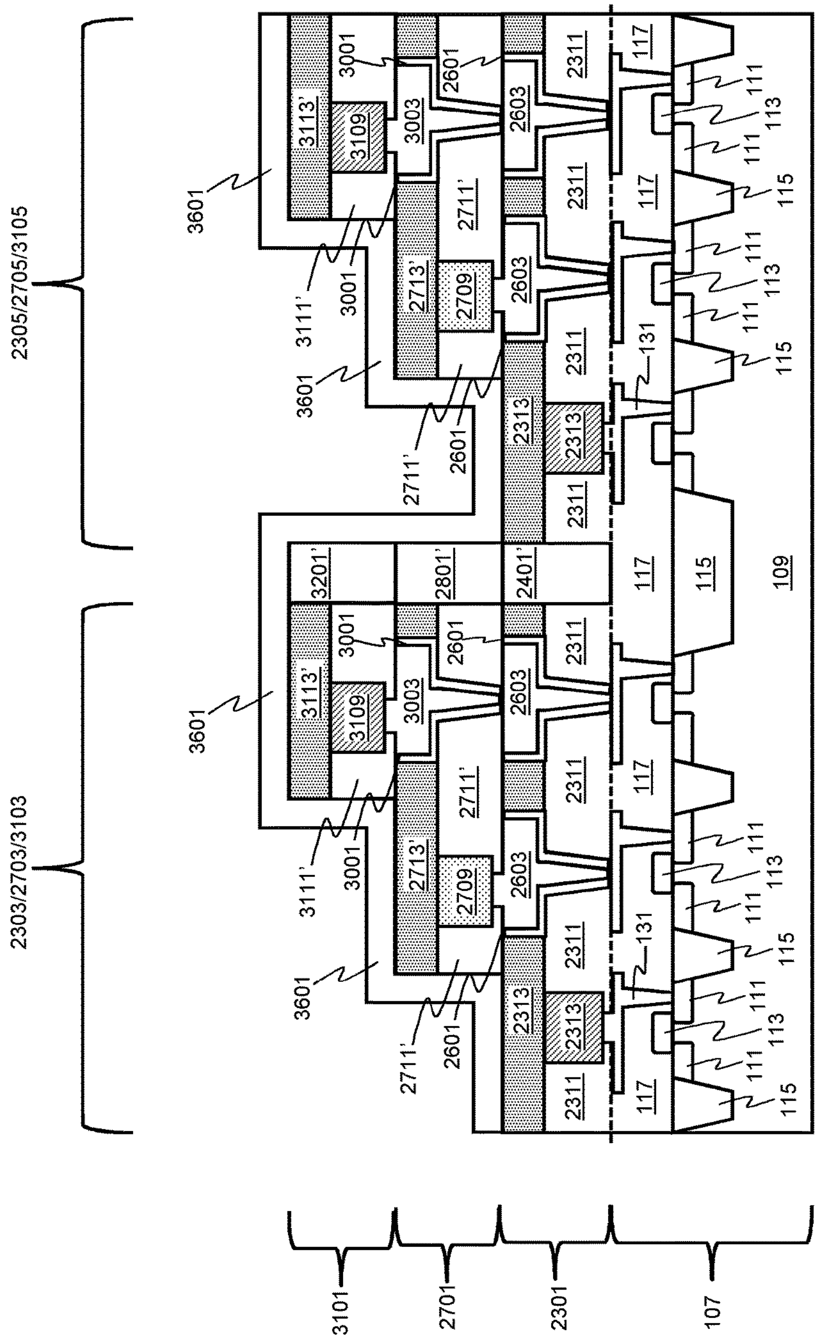
Figure 37:
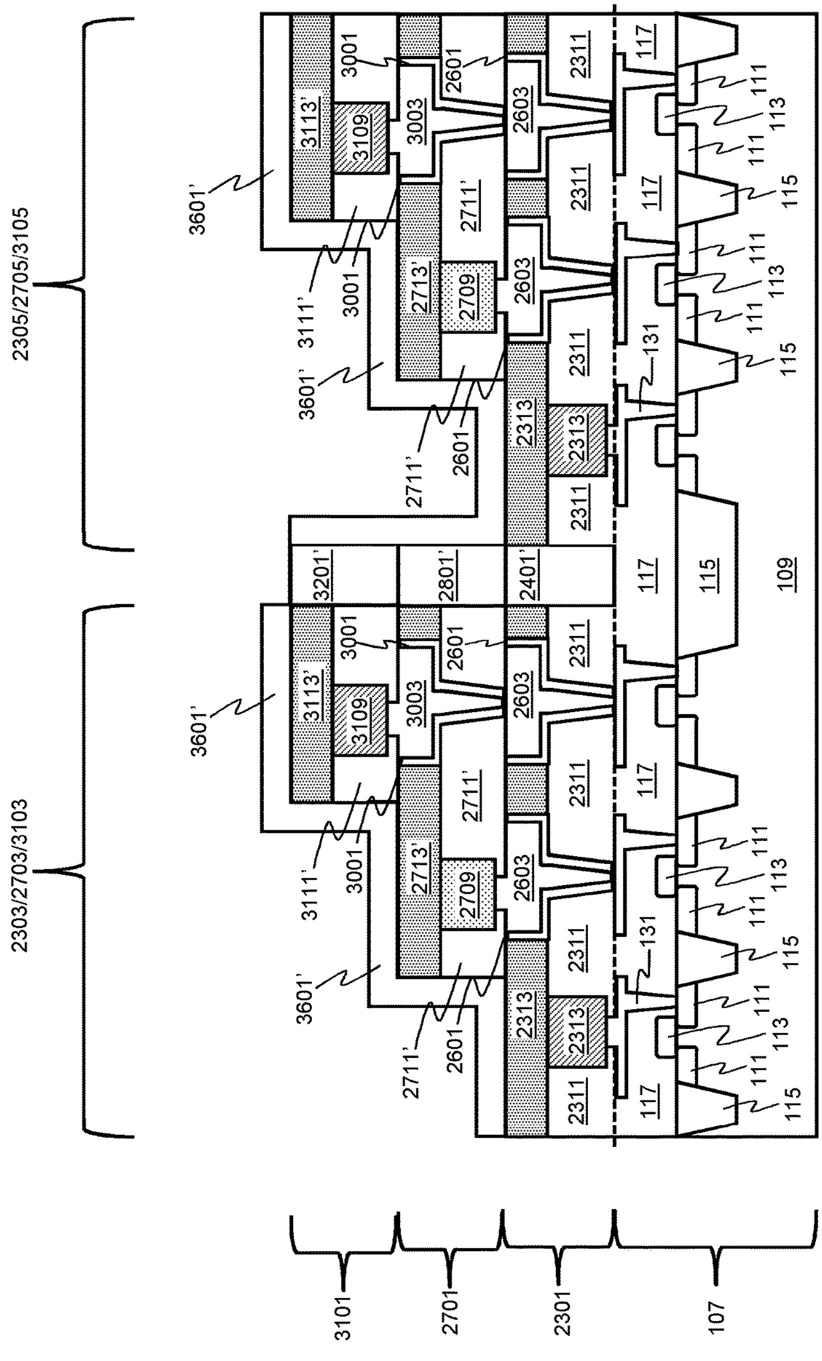
Figure 38:
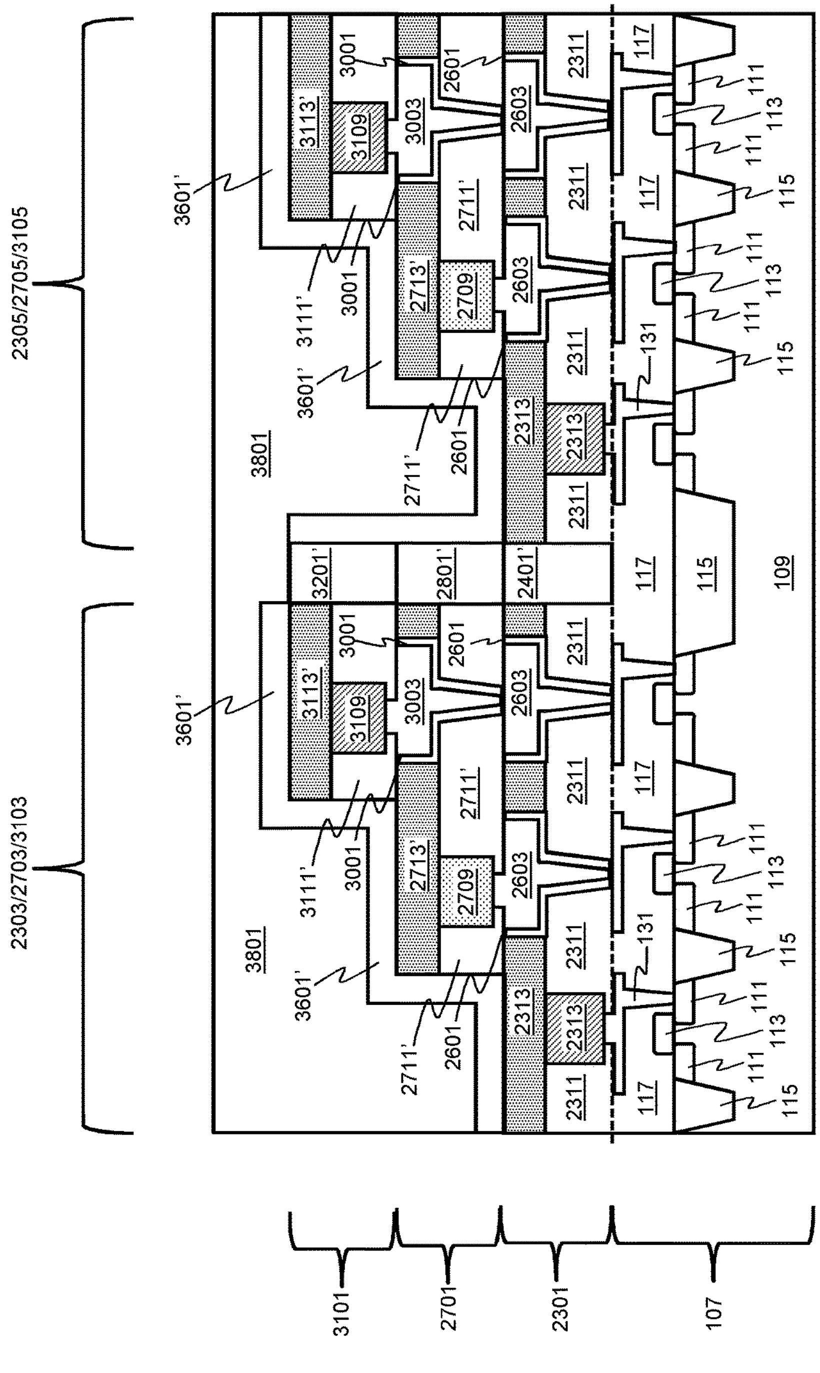

Adverting to FIG. 36, a conformal TCO layer 3601 is formed, e.g., to a thickness of 100 nm to 150 nm, over each color die 2301, 2701, and 3101 and the oxide 3201' as well as the side surfaces of the oxides 3201' and 2801'. A portion of the TCO layer 3601 may then be removed over the oxide 3201' to make the subsequent dicing of the bonded dies 3101, 2701, and 2301 easier, thereby forming the TCO layer 3601', as depicted in FIG. 37. Adverting to FIG. 38, a PECVD oxide layer 3801 is formed over the CMOS wafer 107, e.g., to a thickness of 0.5 μm to 1 μm, e.g., at least above an upper surface of the TCO layer 3601', and then planarized, e.g., by CMP, to complete the rest of the packaging process. Alternatively, the PECVD oxide layer 3801 may be formed over the CMOS wafer 107 without first removing a portion of the TCO layer 3601.

The embodiments of the present disclosure can achieve several technical effects including enabling the use of LEDs made in parallel on smaller substrates, the use of both Si and non-Si substrates, the achievement of lower costs, and the ability to stack and bond different color die materials to maximize color efficiency as well as producing high yielding micro displays by using only known good LED dice on known good Si CMOS wafers. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices including semiconductor-based LEDs.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:

providing a plurality of first color die over a complementary metal-oxide-semiconductor (CMOS) wafer, each first color die being laterally separated with a first oxide and electrically connected to the CMOS wafer;

providing a second color die above each first color die, each second color die being separated from each other with a second oxide, bonded to a first color die, and electrically connected to the CMOS wafer through the bonded first color die;

removing a portion of each second color die to expose a portion of each bonded first color die;

forming a conformal transparent conductive oxide (TCO) layer over each first and second color die and on a side surface of each second color die and oxide;

forming a plasma-enhanced chemical vapor deposition (PECVD) oxide layer over the CMOS wafer; and planarizing the PECVD oxide layer.

2. The method according to claim 1, wherein each first and second color die and the CMOS wafer comprise a known good die (KGD).

3. The method according to claim 2, wherein each first color die comprises two light emitting diodes (LEDs) and each second color die comprises one LED or each first color die comprises the one LED and each second color die comprises the two LEDs.

4. The method according to claim 3, wherein each first or second color die comprises the two LEDs, each first or second color die further comprises blue and green, green and red, or blue and red indium gallium nitride (InGaN) LEDs laterally separated within an oxide layer, a gallium nitride (GaN) buffer layer, and a substrate.

5. The method according to claim 4, wherein each first or second color die comprises the one LED and the one LED is red, each first or second color die further comprises an aluminum indium gallium phosphide (AlInGaP) LED within the oxide layer, a gallium phosphide (GaP) buffer layer, and the substrate.

6. The method according to claim 5, wherein each first or second color die comprises the one LED and the one LED is blue or green, each first or second color die further comprises an InGaN LED within the oxide layer, the GaN buffer layer, and the substrate.

7. The method according to claim 6, comprising bonding and electrically connecting each first and corresponding second color die by:

filling a first trench formed between each pair of adjacent first color dice with the first oxide;

planarizing the first oxide down to the substrate of the first color dice;

planarizing the substrate of the first color dice and first oxide down to the GaN or GaP buffer layer of the first color dice;

etching a contact hole through the GaN or GaP buffer and oxide layers of each first color die for each LED of each second color die;

forming a conformal nitride liner on sidewalls of each contact hole;

filling each contact hole with a metal;

planarizing the metal down to the GaN or GaP buffer layer of the first color dice; and connecting each LED of each second color die to a corresponding metal contact.

8. The method according to claim 7, comprising removing the portion of each second color die by:

planarizing the substrate of the second color dice and second oxide down to the GaN or GaP buffer layer of the second color dice;

forming a mask over the two LEDs or one LED of each second color die and oxide and a portion of the GaN or GaP buffer and oxide layers on opposite sides of the one LED or two LEDs; and etching an exposed portion of the GaN or GaP buffer and oxide layers down to the GaN or GaP buffer layer of the first color dice.

9. The method according to claim 8, wherein the substrate comprises silicon (Si), sapphire, or silicon carbide (SiC).

10. A method comprising:

providing a plurality of first color die over a complementary metal-oxide-semiconductor (CMOS) wafer, each first color die being laterally separated with a first oxide and electrically connected to the CMOS wafer;

providing a second color die above each first color die, each second color die being separated from each other with a second oxide, bonded to a first color die, and electrically connected to the CMOS wafer through the bonded first color die;

providing a third color die above each second color die, each third color die being separated from each other with a third oxide, bonded to a second color die, and electrically connected to the CMOS wafer through the bonded second color die;

removing a portion of each second and each third color die to expose a portion of each first and second color die, respectively;

forming a conformal transparent conductive oxide (TCO) layer over each first, second, and third color die and on a side surface of each second and third color die and oxide;

forming a plasma-enhanced chemical vapor deposition (PECVD) oxide layer over the CMOS wafer; and planarizing the PECVD oxide layer.

11. The method according to claim 10, wherein each first, second, and third color die and the CMOS wafer comprise a known good die (KGD).

12. The method according to claim 11, wherein the first, second, and third color dice each comprise blue, green, or red light emitting diodes (LEDs), and none of the first and second, first and third, or second and third color dice comprise a same color LED.

13. The method according to claim 12, wherein each first, second, and third color die comprises the blue or green LED, each first, second, and third color die further comprises the blue or green indium gallium nitride (InGaN) LED within an oxide layer, a gallium nitride (GaN) buffer layer, and a substrate.

14. The method according to claim 13, wherein each first, second, or third color die comprises the red LED, each first, second, or third color die further comprises a red aluminum indium gallium phosphide (AlInGaP) LED within an oxide layer, a gallium phosphide (GaP) buffer layer, and a substrate.

15. The method according to claim 14, comprising bonding and electrically connecting each first and corresponding second color die by:

filling a first trench formed between each pair of adjacent first color dice with the first oxide;

planarizing the first oxide down to the substrate of the first color dice;

planarizing the substrate of the first color dice and first oxide down to the GaN or GaP buffer layer of the first color dice;

etching two contact holes laterally separated through the GaN or GaP buffer and oxide layers of each first color die;

forming a conformal nitride liner on sidewalls of each of the two contact holes;

filling the two contact holes with a metal;

planarizing the metal down to the GaN or GaP buffer layer of the first color dice; and connecting the blue, green, or red LED of each second color die to one of the two metal contacts.

16. The method according to claim 15, comprising bonding and electrically connecting each second and corresponding third color die by:

filing a second trench formed between each pair of adjacent second color dice with the second oxide;

planarizing the second oxide down to the substrate of the second color dice;

planarizing the substrate of the second color dice and second oxide down to the GaN or GaP buffer layer of the second color dice;

etching a contact hole through the GaN of GaP buffer and oxide layers of each second color die over an open metal contact of the two metal contacts;

forming a conformal nitride liner on sidewalls of the contact hole;

filing the contact hole with a metal;

planarizing the metal down to the GaN or GaP buffer layer of the second color dice; and connecting the blue, green, or red LED of each third color die to the metal contact.

17. The method according to claim 16, comprising removing the portion of each second and each third color die by:

planarizing the substrate of the third color dice and oxide down the GaN or GaP buffer layer of the third color dice;

forming a first mask over the blue, green, or red LED of each third color die and oxide and a portion of the GaN or GaP buffer and oxide layers on opposite sides of the blue, green, or red LED;

etching an exposed portion of the GaN or GaP buffer and oxide layers of the third color dice down to the GaN or GaP buffer layer of the second color dice;

forming a second mask over the blue, green, or red LED of each third and second color die and third oxide, the portion of the GaN and GaP buffer and oxide layers, and a portion of the GaN or GaP buffer and oxide layers on opposite sides of the blue, green, or red LED of each second color die; and etching an exposed portion of the GaN or GaP buffer and oxide layers of the second color die down to the GaN or GaP buffer of the first color dice.

18. The method according to claim 17, wherein the substrate comprises silicon (Si), sapphire, or silicon carbide (SiC).

* * * * *